(12) United States Patent
Wu

(10) Patent No.: US 11,099,066 B2
(45) Date of Patent: Aug. 24, 2021

(54) LIGHT DETECTION SYSTEMS HAVING INPUT AND OUTPUT MODULATORS, AND METHODS OF USE THEREOF

(71) Applicant: Becton, Dickinson and Company, Franklin Lakes, NJ (US)

(72) Inventor: Austin Wu, San Jose, CA (US)

(73) Assignee: BECTON, DICKINSON AND COMPANY, Franklin Lakes, NJ (US)

( * ) Notice: Subject to any disclaimer, the term of this patent is extended or adjusted under 35 U.S.C. 154(b) by 162 days.

(21) Appl. No.: 16/422,805

(22) Filed: May 24, 2019

(65) Prior Publication Data

US 2020/0003615 A1    Jan. 2, 2020

Related U.S. Application Data

(60) Provisional application No. 62/691,570, filed on Jun. 28, 2018.

(51) Int. Cl.
*H01L 31/107* (2006.01)
*G01J 1/44* (2006.01)
(Continued)

(52) U.S. Cl.
CPC ............ *G01J 1/44* (2013.01); *G01N 15/1431* (2013.01); *H01L 31/02005* (2013.01);
(Continued)

(58) Field of Classification Search
CPC ....... G01J 1/44; G01N 15/14; G01N 15/1431; G01N 15/1434; H03F 3/08; H01L 31/02;
(Continued)

(56) References Cited

U.S. PATENT DOCUMENTS

| 4,689,482 A | 8/1987 | Horikawa et al. |
| 5,721,424 A * | 2/1998 | Price ................. H01L 31/02027 250/214 R |

(Continued)

FOREIGN PATENT DOCUMENTS

| JP | 2005136365 | 5/2005 |
| JP | 2014120560 | 6/2014 |

(Continued)

OTHER PUBLICATIONS

Liu, B. et al., "Polyacetylenes containing BODIPY pendants with different connectivities: synthesis, characterization and optoelectronic properties", Polymer Chemistry, Sep. 11, 2013, vol. 5, No. 2, pp. 372-381. Abstract only.

*Primary Examiner* — Que Tan Le
(74) *Attorney, Agent, or Firm* — Peter W. Schroen; Bret E. Field; Bozicevic, Field & Francis LLP

(57) ABSTRACT

Systems for detecting light (e.g., in a flow stream) are described. Light detection systems according to embodiments include a photodetector, an input modulator configured to modulate signal input into the photodetector and an output modulator configured to modulate signal output from the photodetector. Photodetector arrays having a plurality of light detection systems, e.g., as described, are also provided. Methods for matching output signals from two or more photodetectors (e.g., a plurality of photomultiplier tubes in a photodetector array) are also described. Flow cytometer systems and methods for detecting light from a sample in a flow stream are provided. Aspects further include kits having two or more of the subject light detection systems.

21 Claims, 4 Drawing Sheets

(51) Int. Cl.
*G01N 15/14* (2006.01)
*H03F 3/08* (2006.01)
*H01L 31/02* (2006.01)
*H01L 31/0232* (2014.01)

(52) U.S. Cl.
CPC ...... *H01L 31/02325* (2013.01); *H01L 31/107* (2013.01); *H03F 3/08* (2013.01); *G01J 2001/4413* (2013.01); *G01J 2001/4453* (2013.01); *G01J 2001/4466* (2013.01)

(58) Field of Classification Search
CPC ............... H01L 31/107; H01L 31/0232; H01L 31/02325; H01L 31/02005; G02F 1/0123; G02F 1/225; H04B 10/506; H04B 10/54
USPC .......................................... 250/214 R, 214.1
See application file for complete search history.

(56) References Cited

U.S. PATENT DOCUMENTS

| | | | |
|---|---|---|---|
| 6,580,739 | B1 | 6/2003 | Coldren et al. |
| 6,965,103 | B2 | 11/2005 | Shapiro et al. |
| 8,686,343 | B2 * | 4/2014 | Dyer ........................ H03F 3/08 |
| | | | 250/214 R |
| 9,064,981 | B2 * | 6/2015 | Laforce ................... H03F 3/087 |
| 2002/0190221 | A1 | 12/2002 | Hutchinson et al. |
| 2003/0017860 | A1 | 9/2003 | Swager et al. |
| 2004/0175768 | A1 | 9/2004 | Kushon et al. |
| 2007/0127123 | A1 | 6/2007 | Brown et al. |
| 2014/0273193 | A1 | 9/2014 | Li |
| 2015/0069220 | A1 | 3/2015 | Yagisawa |
| 2016/0181764 | A1 | 6/2016 | Kanskar et al. |
| 2016/0266131 | A1 | 9/2016 | Liang et al. |

FOREIGN PATENT DOCUMENTS

| | | |
|---|---|---|
| JP | 2015218304 | 12/2015 |
| WO | WO2007011630 A2 | 1/2007 |
| WO | WO2011154405 | 12/2011 |
| WO | WO2017105927 | 6/2017 |

* cited by examiner

LIGHT DETECTION SYSTEMS HAVING INPUT AND OUTPUT MODULATORS, AND METHODS OF USE THEREOF

CROSS-REFERENCE TO RELATED APPLICATIONS

Pursuant to 35 U.S.C. § 119(e), this application claims priority to the filing date of U.S. Provisional Patent Application Ser. No. 62/691,570 filed Jun. 28, 2018; the disclosure of which application is herein incorporated by reference.

INTRODUCTION

Light detection is often used to characterize components of a sample (e.g., biological samples), for example when the sample is used in the diagnosis of a disease or medical condition. When a sample is irradiated, light can be scattered by the sample, transmitted through the sample as well as emitted by the sample (e.g., by fluorescence). Variations in the sample components, such as morphologies, absorptivity and the presence of fluorescent labels may cause variations in the light that is scattered, transmitted or emitted by the sample. These variations can be used for characterizing and identifying the presence of components in the sample. To quantify these variations, the light is collected and directed to the surface of a detector. The degree to which fluorophore content is determine is often limited, in part, by the fluorescence spectra of multi-fluorophore-containing samples and the spectral overlap between the emitted light.

One technique that utilizes light detection to characterize the components in a sample is flow cytometry. Using data generated from the detected light, distributions of the components can be recorded and where desired material may be sorted. Light from the light source can be detected as scatter or by transmission spectroscopy or can be absorbed by one or more components in the sample and re-emitted as luminescence.

Variations in the materials, such as morphologies or fluorescent label, cause variations in the observed light which allow for characterization by collecting the light onto an optical detector.

SUMMARY

Systems for detecting light (e.g., in a flow stream) are described. Light detection systems according to embodiments include a photodetector, an input modulator configured to modulate signal input into the photodetector and an output modulator configured to modulate signal output from the photodetector. Photodetector arrays having a plurality of light detection systems, e.g., as described, are also provided. Methods for matching output signals from two or more photodetectors (e.g., a plurality of photomultiplier tubes in a photodetector array) are also described. Flow cytometer systems and methods for detecting light from a sample in a flow stream are provided. Aspects further include kits having two or more of the subject light detection systems.

In embodiments, light detection systems include a photodetector, an input modulator configured to modulate signal input into the photodetector and an output modulator configured to modulate signal output from the photodetector. In some embodiments, the photodetector is a photomultiplier tube. In other embodiments, the photodetector is a photodiode, such as an avalanche photodiode. In certain embodiments, the photodetector is a combination of photodetectors, such as a hybrid photomultiplier-photodiode photodetector. For example, the photodetector may include a photomultiplier component and a photodiode component. In certain instances, the photodetector is a combination of a photocathode and an avalanche photodiode. In some embodiments, the photodetector includes one or more integrated optical adjustment components, such as a dichroic mirror or a collimating lens.

Light detection systems include an input modulator that modulates the signal input into the photodetector. The input modulator is, in some embodiments, configured to adjust the current into the photodetector. In some instances, the input modulator increases the current into the photodetector. In other instances, the input modulator decreases the current into the photodetector. In other embodiments, the input modulator is configured to adjust the voltage into the photodetector. In some instances, the input modulator increases the voltage into the photodetector. In other instances, the input modulator decreases the voltage into the photodetector. In certain embodiments, the input modulator includes one or more amplifiers, such as transimpedence amplifiers. In other embodiments, the input modulator includes an array of resistors. In yet other embodiments, the input modulator includes an array of resistors and capacitors.

The light detection system also includes an output modulator configured to modulate the signal output from the photodetector. In certain embodiments, the output modulator is configured to adjust the current from the photodetector. In some instances, the output modulator increases the current from the photodetector. In other instances, the output modulator decreases the current from the photodetector. In other embodiments, the output modulator is configured to adjust the voltage from the photodetector. In some instances, the output modulator increases the voltage from the photodetector. In other instances, the output modulator decreases the voltage from the photodetector. In some embodiments, the output modulator includes one or more amplifiers, such as transimpedence amplifiers. In other embodiments, the output modulator includes an array of resistors. In yet other embodiments, the output modulator includes an array of resistors and capacitors.

In some embodiments, each of the photodetector, the input modulator and the output modulator are mounted on the surface of a substrate. In some instances, the substrate is a printed circuit board (PCB). In these embodiments, one or more of the input modulator and the output modulator is positioned in close proximity to the photodetector, such as where the input modulator is positioned 15 cm or less from the photodetector, such as 10 cm or less, such as 5 cm or less and including 1 cm or less from the photodetector. In other instances, the output modulator is positioned 15 cm or less from the photodetector, such as 10 cm or less, such as 5 cm or less and including 1 cm or less from the photodetector. The positioning of one or more of the input modulator and the output modulator according to certain embodiments of the present disclosure is sufficient to reduce electromagnetic interference in the output signal, such as where noise interference in the output signal is reduced by 250 decibels (dB) or more, such as 200 dB or more, such as 150 dB or more, such as 100 dB or more and including 50 dB or more.

The present disclosure also describes photodetector arrays having a plurality of the subject light detection systems. In some embodiments, the plurality of photodetectors in the array is configured to have substantially the same photosensitivity. In other embodiments, the plurality of photodetectors in the array is configured to have substantially the same dynamic range. In yet other embodiments, the plurality of photodetectors in the array are configured to have substantially the same signal-to-noise ratio. In still other embodiments, the plurality of photodetectors in the array is configured to have substantially the same quantum efficiency.

In embodiments, the photodetector array includes a plurality of light detection systems, as summarized above, each having a photodetector, an input modulator and an output modulator. In some embodiments, the photodetector, input modulator and output modulator of each light detection system are mounted on a substrate, such as a printed circuit board. In some instances, an optical adjustment component is positioned between each light detection system in the photodetector array. For example, each light detection system may include a dichroic mirror or a collimating lens. The light detection systems may be arranged in the photodetector array along a single axis. In other embodiments, the light detection systems are arranged in the photodetector array along more than one axis, such as along two or more parallel axes. In certain embodiments, the photodetector array includes a plurality of light detection systems arranged in a hexagonal configuration, a heptagonal configuration or an octagonal configuration.

Aspects of the present disclosure also include methods for matching output signals from two or more photodetectors. Methods according to certain embodiments include detecting light from a sample with a first photodetector, detecting light with from the sample with a second photodetector and modulating one or more of: an input signal into the first photodetector, an input signal into the second photodetector, an output signal from the first photodetector and an output signal from the second photodetector, to match the output signals from the first photodetector and the second photodetector. In embodiments, the output signals being matched between the photodetectors are one or more of photon counts, output voltage and signal-to-noise ratio. In some embodiments, methods include modulating input signal to one or more of the photodetectors, such as by adjusting the input current or the voltage into the photodetector. In other embodiments, methods include modulating output signal from one or more of the photodetectors, such as by adjusting the output current or voltage.

In certain embodiments, methods include matching output signals for a plurality of photodetectors, such as 3 or more photodetectors, such as 4 or more, such as 5 of more, such as 10 or more and including 25 or more photodetectors. In some instances, methods include matching output signals for a plurality of photodetectors in a photodetector array. In these embodiments, methods may include matching photon counts, output voltage or signal-to-noise ratio, such that the output signal from each of the photodetectors differs by 10% or less, such as by 5% or less, such as by 1% or less and including by 0.1% or less.

Aspects of the present disclosure also include a flow cytometer having a flow cell configured to propagate a sample in a flow stream, a light source for irradiating the sample and one or more of the light detection systems as described herein. In certain embodiments, the sample in the flow stream includes cells and the flow cytometer is configured for characterizing one or more cells or extracellular vesicles of the cells in the sample. Characterizing the extracellular vesicles of the cells may include identifying the type of extracellular vesicles in the cells and/or determining the size of the extracellular vesicles in the cells. The light detection systems may be configured to detect forward scattered light, side scattered light, transmitted light, emitted light or a combination thereof.

Aspects of the present disclosure also include methods for irradiating a sample in a flow stream with a light source and detecting light from the sample. Methods according to certain embodiments include irradiating a sample in the flow stream and detecting one or more of forward scattered light, side scattered light, transmitted light, emitted light from the sample. In certain embodiments, methods include photon counting of light from the sample in the flow stream. In some embodiments, light from the flow stream is measured at discrete wavelengths from 200 nm to 1200 nm, such as for example at one or more wavelengths from 450 nm, 518 nm, 519 nm, 561 nm, 578 nm, 605 nm, 607 nm, 617 nm 625 nm, 647 nm, 650 nm, 660 nm, 667 nm, 670 nm, 668 nm, 695 nm, 710 nm, 723 nm, 780 nm and 785 nm. In other embodiments, light from the flow stream is measured across wavelengths of from 200 nm to 1200 nm, such as for example to generate a spectrum of the light from 200 nm to 1200 nm. Methods may also include characterizing one or more particles (e.g., cells) in the sample. In certain instances, methods further include sorting particles (e.g., cells) from the sample into two or more sample collection containers in response to the detected light. In these embodiments, the particles may be sorted with a droplet deflector configured to apply a deflection force to droplets of the flow stream.

Kits including one or more components of the subject light detection systems are also provided. Kits according to certain embodiments include one or more photodetectors, input modulators and output modulators. In certain embodiments, kits include a substrate (e.g., a PCB) for mounting the components of the light detection systems. Kits may also include one or more optical adjustment components such as a focusing lens, a collimator, beam splitter, a wavelength separator or a combination thereof.

BRIEF DESCRIPTION OF THE FIGURE

The invention may be best understood from the following detailed description when read in conjunction with the accompanying drawing. Included in the drawing is the following figure.

DETAILED DESCRIPTION

Figure 1:
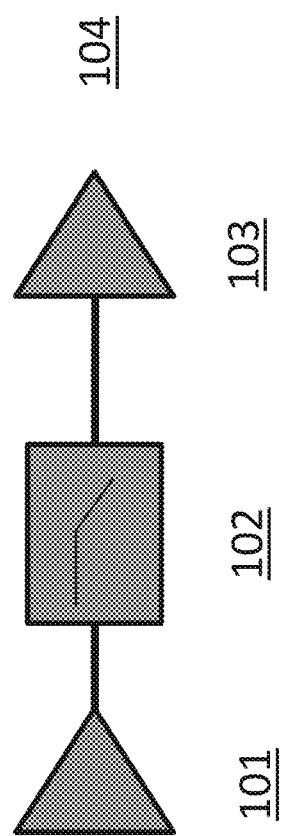
FIG. 1 depicts a schematic of an input modulator according to certain embodiments.

Systems for detecting light (e.g., in a flow stream) are described. Light detection systems according to embodiments include a photodetector, an input modulator configured to modulate signal input into the photodetector and an output modulator configured to modulate signal output from the photodetector. Photodetector arrays having a plurality of light detection systems, e.g., as described, are also provided. Methods for matching output signals from two or more photodetectors (e.g., a plurality of photomultiplier tubes in a photodetector array) are also described. Flow cytometer systems and methods for detecting light from a sample in a flow stream are provided. Aspects further include kits having two or more of the subject light detection systems.

Before the present invention is described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Certain ranges are presented herein with numerical values being preceded by the term "about." The term "about" is used herein to provide literal support for the exact number that it precedes, as well as a number that is near to or approximately the number that the term precedes. In determining whether a number is near to or approximately a specifically recited number, the near or approximating unrecited number may be a number which, in the context in which it is presented, provides the substantial equivalent of the specifically recited number.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

While the apparatus and method has or will be described for the sake of grammatical fluidity with functional explanations, it is to be expressly understood that the claims, unless expressly formulated under 35 U.S.C. § 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. § 112 are to be accorded full statutory equivalents under 35 U.S.C. § 112.

As summarized above, the present disclosure provides systems for detecting light. In further describing embodiments of the disclosure, light detection systems having a photodetector, an input modulator and an output modulator are first described in greater detail. Next, photodetector arrays having a plurality of light detection systems, for example each on a substrate (e.g., PCB) are described. Methods for matching output signals from two or more photodetectors are also described. Flow cytometer systems and methods for detecting light from a sample in a flow stream are also provided. Kits having a photodetector, an input modulator and an output modulator are described.

Light Detection Systems

Aspects of the present disclosure include light detection systems. In embodiments, light detection systems include a photodetector, an input modulator configured to modulate signal input into the photodetector and an output modulator configured to modulate signal output from the photodetector. As described in greater detail below, light detection systems according to certain embodiments provide for photosensitivity matching between two or more photodetectors, such as two or more photomultiplier tubes. In some embodiments, the subject light detection systems are configured to match photon counts of two or more photodetectors. For example, the two or more photodetectors may be modulated to output photon counts that differ by 10% or less, such as 9% or less, such as by 8% or less, such as by 7% or less, such as by 6% or less, such as by 5% or less, such as by 4% or less, such as by 3% or less, such as by 2% or less, such as by 1% or less, such as by 0.5% or less, such as by 0.1% or less, such as by 0.01% or less and including by 0.001% or less. In certain embodiments, light detection systems described herein are configured such that the two or more photodetectors output photon counts that are identical.

In other embodiments, the subject light detection systems are configured to match output voltage from two or more photodetectors. For example, the two or more photodetectors may be modulated to provide output voltages that differ by 10 mV or less, such as by 5 mV or less, such as by 4 mV or less, such as by 3 mV or less, such as by 2 mV or less, such as by 1 mV or less, such as by 0.5 mV or less, such as by 0.1 mV or less, such as by 0.01 mV or less and including by 0.001 mV or less. In some instances, the output voltages from the two or more photodetectors differ by 10% or less, such as 9% or less, such as by 8% or less, such as by 7% or less, such as by 6% or less, such as by 5% or less, such as by 4% or less, such as by 3% or less, such as by 2% or less, such as by 1% or less, such as by 0.5% or less, such as by 0.1% or less, such as by 0.01% or less and including by 0.001% or less. In certain embodiments, the light detection systems are modulated so that output voltages of the two or more photodetectors are identical.

In some embodiments, the light detection systems provide for matching dynamic range of two or more photodetectors. In these embodiments, the two or more photodetectors may be configured to provide substantially the same output signal in response to low intensity light, such as where the output voltage from each photodetector differs by 10% or less in response to low intensity light, such as by 9% or less, such as by 8% or less, such as by 7% or less, such as by 6% or less, such as by 5% or less, such as by 4% or less, such as by 3% or less, such as by 2% or less, such as by 1% or less, such as by 0.5% or less, such as by 0.1% or less, such as by 0.01% or less and including by 0.001% or less.

In still other embodiments, the light detection systems provide for matching signal-to-noise ratio for two or more photodetectors, such as where the signal-to-noise ratio of the photodetectors differ by 10% or less, such as by 9% or less, such as by 8% or less, such as by 7% or less, such as by 6% or less, such as by 5% or less, such as by 4% or less, such as by 3% or less, such as by 2% or less, such as by 1% or less, such as by 0.5% or less, such as by 0.1% or less, such as by 0.01% or less and including by 0.001% or less.

In embodiments, light detection systems include a photodetector. Photodetectors of interest may include, but are not limited to photomultiplier tubes, optical sensors, such as active-pixel sensors (APSs), avalanche photodiode, image sensors, charge-coupled devices (CODs), intensified charge-coupled devices (ICCDs), light emitting diodes, photon counters, bolometers, pyroelectric detectors, photoresistors, photovoltaic cells, photodiodes, phototransistors, quantum dot photoconductors or photodiodes and combinations thereof, among other photodetectors, semiconductor charge-coupled devices (CCD), active pixel sensors (APS), complementary metal-oxide semiconductor (CMOS) image sensors, N-type metal-oxide semiconductor (NMOS) image sensors and combinations thereof. In certain embodiments, the photodetector is a combination of one or more optical sensors, such as a photomultiplier tube and a photodiode. In certain instances, the photodetector is a hybrid photosensor that combines a photocathode and an avalanche photodiode.

Each photodetector (e.g., photomultiplier tube) may have an active surface with a width that ranges from 5 μm to 250 μm, such as from 10 μm to 225 μm, such as from 15 μm to 200 μm, such as from 20 μm to 175 μm, such as from 25 μm to 150 μm, such as from 30 μm to 125 μm and including from 50 μm to 100 μm and a length that ranges from 5 μm to 250 μm, such as from 10 μm to 225 μm, such as from 15 μm to 200 μm, such as from 20 μm to 175 μm, such as from 25 μm to 150 μm, such as from 30 μm to 125 μm and including from 50 μm to 100 μm, where the surface area of each photodetector (e.g., photodiode) in the array ranges from 25 to $\mu m^2$ to 10000 $\mu m^2$, such as from 50 to $\mu m^2$ to 9000 $\mu m^2$, such as from 75 to $\mu m^2$ to 8000 $\mu m^2$, such as from 100 to $\mu m^2$ to 7000 $\mu m^2$, such as from 150 to $\mu m^2$ to 6000 $\mu m^2$ and including from 200 to $\mu m^2$ to 5000 $\mu m^2$.

The size of the photodetector component may vary depending on the amount and intensity of the light and the desired sensitivity and may have a length that ranges from 0.01 mm to 100 mm, such as from 0.05 mm to 90 mm, such as from 0.1 mm to 80 mm, such as from 0.5 mm to 70 mm, such as from 1 mm to 60 mm, such as from 2 mm to 50 mm, such as from 3 mm to 40 mm, such as from 4 mm to 30 mm and including from 5 mm to 25 mm. The width of the photodetector array may also vary, ranging from 0.01 mm to 100 mm, such as from 0.05 mm to 90 mm, such as from 0.1 mm to 80 mm, such as from 0.5 mm to 70 mm, such as from 1 mm to 60 mm, such as from 2 mm to 50 mm, such as from 3 mm to 40 mm, such as from 4 mm to 30 mm and including from 5 mm to 25 mm. As such, the active surface of the photodetector component may range from 0.1 $mm^2$ to 10000 $mm^2$, such as from 0.5 $mm^2$ to 5000 $mm^2$, such as from 1 $mm^2$ to 1000 $mm^2$, such as from 5 $mm^2$ to 500 $mm^2$, and including from 10 $mm^2$ to 100 $mm^2$.

Photodetectors of interest are configured to measure collected light at one or more wavelengths, such as at 2 or more wavelengths, such as at 5 or more different wavelengths, such as at 10 or more different wavelengths, such as at 25 or more different wavelengths, such as at 50 or more different wavelengths, such as at 100 or more different wavelengths, such as at 200 or more different wavelengths, such as at 300 or more different wavelengths and including measuring light emitted by a sample at 400 or more different wavelengths.

In some embodiments, photodetectors are configured to measure collected light over a range of wavelengths (e.g., 200 nm-1000 nm). In certain embodiments, photodetectors of interest are configured to collect spectra of light over a range of wavelengths. For example, systems may include one or more detectors configured to collect spectra of light over one or more of the wavelength ranges of 200 nm-1000 nm. In yet other embodiments, detectors of interest are configured to measure light from the sample in the flow stream at one or more specific wavelengths. For example, systems may include one or more detectors configured to measure light at one or more of 450 nm, 518 nm, 519 nm, 561 nm, 578 nm, 605 nm, 607 nm, 625 nm, 650 nm, 660 nm, 667 nm, 670 nm, 668 nm, 695 nm, 710 nm, 723 nm, 780 nm, 785 nm, 647 nm, 617 nm and any combinations thereof. In certain embodiments, photodetectors may be configured to be paired with specific fluorophores, such as those used with the sample in a fluorescence assay.

As summarized above, light detection systems also include one or more input modulators configured to modulate signal input into the photodetector. In some embodiments, the input signal is modulated by increasing the current into the photodetector, such as by increasing the current by 5% or more, such as by 10% or more, such as by 15% or more, such as by 25% or more, such as by 50% or more, such as by 75% or more, such as by 90% or more, such as by 95% or more and including by 99% or more. In other embodiments, the input signal is modulated by decreasing the current into the photodetector, such as by reducing the current by 5% or more, such as by 10% or more, such as by 15% or more, such as by 25% or more, such as by 50% or more, such as by 75% or more, such as by 90% or more, such as by 95% or more and including by 99% or more.

In yet other embodiments, the input signal is modulated by increasing the voltage into the photodetector, such as by increasing the voltage by 5% or more, such as by 10% or more, such as by 15% or more, such as by 25% or more, such as by 50% or more, such as by 75% or more, such as by 90% or more, such as by 95% or more and including by 99% or more. In still other embodiments, the input signal is modulated by decreasing the voltage into the photodetector, such as by reducing the voltage by 5% or more, such as by 10% or more, such as by 15% or more, such as by 25% or more, such as by 50% or more, such as by 75% or more, such as by 90% or more, such as by 95% or more and including by 99% or more.

As described in greater detail below, the input signal may also be modulated over time such as where the input modulator is configured to increase or decrease signal input into the photodetector at different times, such as to match the signal output of the photodetector with one or more other photodetectors (e.g., in a photodetector array). For example, the input modulator may include a digital memory chip in communication with a processor having algorithm with instructions to adjust the signal input into the photodetector:

1) at predetermined times; 2) in response to a user command or 3) in response to changes in the output signal by one or more other photodetectors.

In some embodiments, the input modulator includes one or more amplifiers, such as 2 or more amplifiers, such as 3 or more amplifiers, such as 4 or more amplifiers, such as 5 or more amplifiers, such as 6 or more amplifiers, such as 7 or more amplifiers, such as 8 or more amplifiers, such as 9 or more amplifiers, such as 10 or more amplifiers, such as 15 or more amplifiers, such as 25 or more amplifiers, such as 50 or more amplifiers, such as 100 or more amplifiers, such as 250 or more amplifiers, such as 500 or more amplifiers, such as 750 or more amplifiers and including 1000 or more amplifiers. In certain embodiments, the input modulator includes 2 or more transimpedence amplifiers, such as 3 or more transimpedence amplifiers, such as 4 or more transimpedence amplifiers, such as 5 or more transimpedence amplifiers, such as 6 or more transimpedence amplifiers, such as 7 or more transimpedence amplifiers, such as 8 or more transimpedence amplifiers, such as 9 or more transimpedence amplifiers, such as 10 or more transimpedence amplifiers, such as 15 or more transimpedence amplifiers, such as 25 or more transimpedence amplifiers, such as 50 or more transimpedence amplifiers, such as 100 or more transimpedence amplifiers, such as 250 or more transimpedence amplifiers, such as 500 or more transimpedence amplifiers, such as 750 or more transimpedence amplifiers and including 1000 or more transimpedence amplifiers.

In some embodiments, the input modulator is composed of resistors, capacitors or a combination thereof. In certain instances, the input modulator includes an array of resistors, such as an array of resistors having 2 or more resistors, such as 3 or more resistors, such as 4 or more resistors, such as 5 or more resistors, such as 6 or more resistors, such as 7 or more resistors, such as 8 or more resistors, such as 9 or more resistors, such as 10 or more resistors, such as 15 or more resistors, such as 25 or more resistors, such as 50 or more resistors, such as 100 or more resistors, such as 250 or more resistors, such as 500 or more resistors, such as 750 or more resistors and including 1000 or more resistors. In other instances, the input modulator is an array of resistors and capacitors, such as an array having 2 or more resistors and capacitors, such as 3 or more resistors and capacitors, such as 4 or more resistors and capacitors, such as 5 or more resistors and capacitors, such as 6 or more resistors and capacitors, such as 7 or more resistors and capacitors, such as 8 or more resistors and capacitors, such as 9 or more resistors and capacitors, such as 10 or more resistors and capacitors, such as 15 or more resistors and capacitors, such as 25 or more resistors and capacitors, such as 50 or more resistors and capacitors, such as 100 or more resistors and capacitors, such as 250 or more resistors and capacitors, such as 500 or more resistors and capacitors, such as 750 or more resistors and capacitors and including 1000 or more resistors and capacitors.

In some embodiments, the light detection system includes a number of input modulators that is equal to the number of photodetectors. For example, light detection systems may include N photodetectors and N input modulators (e.g., amplifiers, resistors, capacitors, etc.) such as where N is an integer from 2 to 1024, such as where N is from 4 to 512, such as where N is from 8 to 256 and including where N is from 16 to 128. In certain instances, N is 1 (i.e., the light detection system includes 1 photodetector and 1 input amplifier). In other instances, N is 8. In yet other instances, N is 16. In still other instances, N is 32. In other embodiments, light detection systems include N photodetectors and 2N input modulators, such as where N is an integer from 2 to 1024, such as where N is from 4 to 512, such as where N is from 8 to 256 and including where N is from 16 to 128. In still other embodiments, light detection systems include N photodetectors and N/2 input modulators, such as a single input modulator controls signal input into two different photodetectors. In these embodiments, N may an integer from 2 to 1024, such as where N is from 4 to 512, such as where N is from 8 to 256 and including where N is from 16 to 128.

In some embodiments, the input modulator may include one or more filters, such as 2 or more filters, such as 3 or more filters, such as 4 or more filters, such as 5 or more filters and including 10 or more filters. In some embodiments, the filter is an electromagnetic interference filter. In other embodiments, the filter is a bandpass filter.

FIG. 1 depicts a schematic of an input modulator according to certain embodiments. Input modulator 100 includes a power control input 101 in electrical communication with filter 102 (e.g., an electromagnetic interference filter) and a current and voltage modulator 103. The signal input into photodetector 104 can then be modulated to control the photosensitivity of photodetector 104.

Light detection systems also include one or more output modulators configured to modulate signal output from the photodetector. In some embodiments, the output signal is modulated by increasing the current of the signal from the photodetector, such as by increasing the current by 5% or more, such as by 10% or more, such as by 15% or more, such as by 25% or more, such as by 50% or more, such as by 75% or more, such as by 90% or more, such as by 95% or more and including by 99% or more. In other embodiments, the output signal is modulated by decreasing the current of the signal from the photodetector, such as by reducing the current by 5% or more, such as by 10% or more, such as by 15% or more, such as by 25% or more, such as by 50% or more, such as by 75% or more, such as by 90% or more, such as by 95% or more and including by 99% or more.

In yet other embodiments, the output signal is modulated by increasing the voltage of the signal from the photodetector, such as by increasing the voltage by 5% or more, such as by 10% or more, such as by 15% or more, such as by 25% or more, such as by 50% or more, such as by 75% or more, such as by 90% or more, such as by 95% or more and including by 99% or more. In still other embodiments, the output signal is modulated by decreasing the voltage of the signal from the photodetector, such as by reducing the voltage by 5% or more, such as by 10% or more, such as by 15% or more, such as by 25% or more, such as by 50% or more, such as by 75% or more, such as by 90% or more, such as by 95% or more and including by 99% or more.

The output signal, independently from the input signal, may also be modulated over time such as where the output modulator is configured to increase or decrease signal output from the photodetector at different times, such as to match the signal output of the photodetector with one or more other photodetectors (e.g., in a photodetector array). For example, the output modulator may include a digital memory chip in communication with a processor having algorithm with instructions to adjust the outputted signal from the photodetector: 1) at predetermined times; 2) in response to a user command or 3) in response to changes in output signal by one or more other photodetectors.

In some embodiments, the output modulator includes one or more amplifiers, such as 2 or more amplifiers, such as 3 or more amplifiers, such as 4 or more amplifiers, such as 5 or more amplifiers, such as 6 or more amplifiers, such as 7 or more amplifiers, such as 8 or more amplifiers, such as 9 or more amplifiers, such as 10 or more amplifiers, such as 15 or more amplifiers, such as 25 or more amplifiers, such as 50 or more amplifiers, such as 100 or more amplifiers, such as 250 or more amplifiers, such as 500 or more amplifiers, such as 750 or more amplifiers and including 1000 or more amplifiers. In certain embodiments, the output modulator includes 2 or more transimpedence amplifiers, such as 3 or more transimpedence amplifiers, such as 4 or more transimpedence amplifiers, such as 5 or more transimpedence amplifiers, such as 6 or more transimpedence amplifiers, such as 7 or more transimpedence amplifiers, such as 8 or more transimpedence amplifiers, such as 9 or more transimpedence amplifiers, such as 10 or more transimpedence amplifiers, such as 15 or more transimpedence amplifiers, such as 25 or more transimpedence amplifiers, such as 50 or more transimpedence amplifiers, such as 100 or more transimpedence amplifiers, such as 250 or more transimpedence amplifiers, such as 500or more transimpedence amplifiers, such as 750 or more transimpedence amplifiers and including 1000 or more transimpedence amplifiers.

In some embodiments, the output modulator is composed of resistors, capacitors or a combination thereof. In certain instances, the output modulator includes an array of resistors, such as an array of resistors having 2 or more resistors, such as 3 or more resistors, such as 4 or more resistors, such as 5 or more resistors, such as 6 or more resistors, such as 7 or more resistors, such as 8 or more resistors, such as 9 or more resistors, such as 10 or more resistors, such as 15 or more resistors, such as 25 or more resistors, such as 50 or more resistors, such as 100 or more resistors, such as 250 or more resistors, such as 500 or more resistors, such as 750 or more resistors and including 1000 or more resistors. In other instances, the output modulator is an array of resistors and capacitors, such as an array having 2 or more resistors and capacitors, such as 3 or more resistors and capacitors, such as 4 or more resistors and capacitors, such as 5 or more resistors and capacitors, such as 6 or more resistors and capacitors, such as 7 or more resistors and capacitors, such as 8 or more resistors and capacitors, such as 9 or more resistors and capacitors, such as 10 or more resistors and capacitors, such as 15 or more resistors and capacitors, such as 25 or more resistors and capacitors, such as 50 or more resistors and capacitors, such as 100 or more resistors and capacitors, such as 250 or more resistors and capacitors, such as 500 or more resistors and capacitors, such as 750 or more resistors and capacitors and including 1000 or more resistors and capacitors.

In some embodiments, the light detection system includes a number of output modulators that is equal to the number of photodetectors. For example, light detection systems may include N photodetectors and N output modulators (e.g., amplifiers, resistors, capacitors, etc.) such as where N is an integer from 2 to 1024, such as where N is from 4 to 512, such as where N is from 8 to 256 and including where N is from 16 to 128. In certain instances, N is 1 (i.e., the light detection system includes 1 photodetector and 1 output amplifier). In other instances, N is 8. In yet other instances, N is 16. In still other instances, N is 32. In other embodiments, light detection systems include N photodetectors and 2N output modulators, such as where N is an integer from 2 to 1024, such as where N is from 4 to 512, such as where N is from 8 to 256 and including where N is from 16 to 128. In still other embodiments, light detection systems include N photodetectors and N/2 output modulators, such as where two photodetectors output signal to a single output modulator. In these embodiments, N may an integer from 2 to 1024, such as where N is from 4 to 512, such as where N is from 8 to 256 and including where N is from 16 to 128.

In some embodiments, the output modulator may include one or more filters, such as 2 or more filters, such as 3 or more filters, such as 4 or more filters, such as 5 or more filters and including 10 or more filters. In some embodiments, the filter is an electromagnetic interference filter. In other embodiments, the filter is a bandpass filter.

Figure 2:
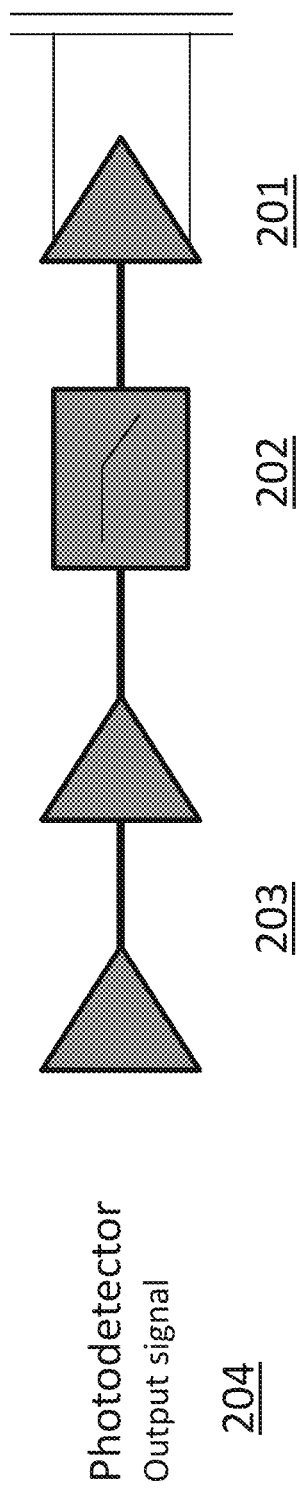
FIG. 2 depicts a schematic of an input modulator according to certain embodiments.

FIG. 2 depicts a schematic of an output modulator according to certain embodiments. Output modulator 200 is in electrical communication with photodetector 204 which outputs a signal to output modulator (e.g., amplifier) 203. The voltage or current output from photodetector 204 may be modulated with modulator 203 and electrically propagated through filter (e.g., bandpass filter) 202 to differential driver 201.

In embodiments, the ratio of the number of input modulators and output modulators can vary depending on the type of modulator employed (e.g., array of resistors, capacitors, amplifiers, etc.) as well as the desired photosensitivity matching of the photodetectors. In some embodiments, the light detection system includes 1 input modulator and 1 output modulator. In other embodiments, the light detection system includes 1 input modulator and 2 or more output modulators, such as 3 or more, such as 4 or more, such 5 or more output modulators, such as 6 or more output modulators, such as 7 or more output modulators, such as 8 or more output modulators, such as 9 or more output modulators and including 1 input modulator and 10 or more output modulators. In still other embodiments, the light detection system includes 1 output modulator and 2 or more input modulators, such as 3 or more, such as 4 or more, such 5 or more input modulators, such as 6 or more input modulators, such as 7 or more input modulators, such as 8 or more input modulators, such as 9 or more input modulators and including 1 output modulator and 10 or more input modulators. In embodiments, the ratio of input modulators to output modulators in light detections systems of interest may range from 10:1 to 1:10, such as from 9:1 to 1:9, such as from 8:1 to 1:8, such as from 7:1 to 1:7, such as from 6:1 to 1:6, such as from 5:1 to 1:5, such as from 4:1 to 1:4, such as from 3:1 to 1:3, such as from 2:1 to 1:2 and including a ratio of input modulators to output modulators of from 1:1.

In some embodiments, each of the input modulator, photodetector and output modulator are mounted onto a surface of a substrate. In certain embodiments, the substrate is a printed circuit board. Each component of the light detection system may be attached to a surface of the substrate by any convenient mounting protocol. In some embodiments, the input modulator, output modulator and photodetector are independently non-releasably affixed to the substrate by soldering, molding, welding or affixing the laser assembly to the substrate with a permanent adhesive. In other embodiments, each of the input modulator, output modulator and photodetector are independently are releasably affixed to the substrate, such as with a hook and loop fastener, a latch, a notch, a groove, a pin, a tether, a hinge, Velcro, non-permanent adhesive, a threaded screw, or a combination thereof.

In some embodiments, the positioning of the input modulator, photodetector and output modulator on the surface of the substrate is sufficient to reduce electromagnetic interference in the output signal, such as where noise interference in the output signal is reduced by 250 decibels (dB) or more, such as 200 dB or more, such as 150 dB or more, such as 100 dB or more and including 50 dB or more. In some embodiments, the input modulator is positioned 10 cm or less from the photodetector, such as where the electrical signal from the input modulator are conveyed 10 cm or less to the photodetector, such as 9 cm or less, such as 8 cm or less, such as 7 cm or less, such as 6 cm or less, such as 5 cm or less, such as 4 cm or less, such as 3 cm or less, such as 2 cm or less, such as 1 cm or less and including 0.5 cm or less. In certain embodiments, the input modulator is positioned immediately adjacent to the photodetector such that signal input from the input modulator is conveyed 0.1 cm or less to the photodetector. In some embodiments, the output modulator is positioned 10 cm or less from the photodetector, such as where the signals from the photodetector are conveyed 10 cm or less to the output modulator, such as 9 cm or less, such as 8 cm or less, such as 7 cm or less, such as 6 cm or less, such as 5 cm or less, such as 4 cm or less, such as 3 cm or less, such as 2 cm or less, such as 1 cm or less and including 0.5 cm or less. In certain embodiments, the output modulator is positioned immediately adjacent to the photodetector such that signal output from the photodetector is conveyed 0.1 cm or less to the output modulator.

Photodetector Arrays having a Plurality of Light Detection Systems

Aspects of the present disclosure also include a photodetector array. In embodiments, each light detection system in the photodetector array includes, as described above, a photodetector, an input modulator configured to modulate signal input into the photodetector and an output modulator configured to modulate signal output from the photodetector. In some embodiments, each of the light detection systems in the photodetector array is mounted on a substrate, such as a printed circuit board (as described above).

In embodiments of the present disclosure, the light detection systems in the photodetector array may be photosensitivity matched, such as where the output signals from each of the light detection systems are substantially the same in response to the same source of detected light. In some embodiments, each photodetector in the photodetector array is configured to receive propagated light from a sample (e.g., a sample in a flow stream of a flow cytometer) and the photon count output signal from each of the light detection system is substantially same. In other embodiments, the output voltage signal of each of the photodetectors in the array is substantially the same. In yet other embodiments, the output signal from each photodetector in the array has substantially the same signal-to-noise ratio.

The subject photodetector arrays include an arrangement or series of two or more of the light detection systems. In embodiments, photodetector arrays may include 2 or more of the subject light detection systems, such as 3 or more light detection systems, such as 4 or more light detection systems, such as 5 or more light detection systems, such as 6 or more light detection systems, such as 7 or more light detection systems, such as 8 or more light detection systems, such as 9 or more light detection systems, such as 10 or more light detection systems, such as 12 or more light detection systems and including 15 or more light detection systems. In certain embodiments, photodetector arrays include 5 light detection systems. The light detection systems may be arranged in any geometric configuration as desired, where arrangements of interest include, but are not limited to a square configuration, rectangular configuration, trapezoidal configuration, triangular configuration, hexagonal configuration, heptagonal configuration, octagonal configuration, nonagonal configuration, decagonal configuration, dodecagonal configuration, circular configuration, oval configuration as well as irregular shaped configurations. In certain embodiments, the photodetector array has a decagonal configuration. The light detection systems in the photodetector array may be oriented with respect to the other (as referenced in an X-Z plane) at an angle ranging from 10° to 180°, such as from 15° to 170°, such as from 20° to 160°, such as from 25° to 150°, such as from 30° to 120° and including from 45° to 90°. In embodiments, the light detection systems may be arranged with respect to each other at an angle that is the same or different depending on the number of light detection systems and any optical adjustment component positioned between the photodetectors of the light detection systems. For example, in certain instances the angle between a first light detection system and a second light detection system is the same as the angle between the second light detection system and a third light detection system. In some embodiments, the angle between a first light detection system and a second light detection system are different than the angle between the second light detection system and a third light detection system.

In some embodiments, the photodetector array includes one or more optical adjustment components. By the term "optical adjustment" is meant that light is changed or adjusted. For example, the optical adjustment may be to change the profile of the light beam, the focus of the light beam, the direction of beam propagation or to collimate the light beam. Optical adjustment protocols may be any convenient device which adjusts one or more characteristics of the detected light, including but not limited to lenses, mirrors, filters, fiber optics, wavelength separators, pinholes, slits, collimating protocols and combinations thereof. In certain embodiments, the photodetector arrays include one or more focusing lenses. The focusing lens, in one example may be a de-magnifying lens. In another example, the focusing lens is a magnifying lens. In other embodiments, the photodetector array includes one or more mirrors, such as a dichroic mirror. In still other embodiments, the photodetector array may include one or more collimating lenses. The photodetector array may include one or more optical adjustment components as needed, such as two or more, such as three or more, such as four or more and including five or more optical adjustment components.

In some embodiments, systems of interest (e.g., flow cytometer systems as described in detail below) include two or more photodetector arrays. Depending on the type of light being detected, the number of photodetector arrays may vary as desired, and may be three or more photodetector arrays, such as four or more, such as five or more, such as six or more, such as seven or more, such as eight or more, such as nine or more, such as ten or more, such as eleven or more, such as twelve or more, such as thirteen or more, such as fourteen or more and including fifteen or more photodetector arrays. In some instances, one or more of the photodetector arrays are in optical communication with each other. As such, light from each photodetector array may be propagated to one or more of the other photodetector arrays.

The photodetector arrays may be arranged in any geometric configuration as desired, where arrangements of interest include, but are not limited to a linear configuration, star-shaped configuration, a triangular configuration, a square configuration, rectangular configuration, trapezoidal configuration, triangular configuration, hexagonal configuration, heptagonal configuration, octagonal configuration, nonagonal configuration, decagonal configuration, dodecagonal configuration, circular configuration, oval configuration as well as irregular shaped configurations.

The photodetector arrays may be arranged along one or more axis. In embodiments, the photodetector arrays may be oriented with respect to the other (as referenced in an X-Z plane) at an angle ranging from 0° to 180°, such as from 10° to 170°, such as from 20° to 160°, such as from 25° to 150°, such as from 30° to 120° and including from 45° to 90°. In embodiments, the photodetector arrays may be arranged with respect to each other at an angle that is the same or different depending on the number of photodetector arrays and the optical adjustment component positioned between the photodetector arrays. For example, in certain instances the angle between a first photodetector array and a second photodetector array is the same as the angle between the second photodetector array and a third photodetector array. In some embodiments, the angle between a first photodetector array and a second photodetector array are different than the angle between the second photodetector array and a third photodetector array.

In some embodiments, the photodetector arrays are arranged along two or more parallel axes, such as along three or more, such as four or more, such as five or more, such as six or more, such as seven or more, such as eight or more, such as nine or more and including ten or more parallel axes. In some instances, each parallel axis may include the same number of photodetector arrays. In other instances, each parallel axis may include a different number or photodetector arrays. Each axis may include one or more photodetector array, such as two or more photodetector arrays, such as three or more photodetector arrays, such as four or more photodetector arrays and including five or more photodetector arrays. The photodetector arrays positioned along the different axes are in optical communication through an optical adjustment component, as described above, such as a beam splitter or a dichroic mirror.

In certain embodiments, light detection systems include photodetector arrays that are concentrically arranged. The term concentric is used herein in its conventional sense to refer to an arrangement where each photodetector arrays is positioned equidistantly from a central point in the subject light collection system. In some instances, the center of each photodetector array is equidistant from a central point of the light detection system. In other instances, the entry orifice into each photodetector array is equidistant from a central point of the light detection system. The central point may include one or more optical adjustment components as described above (e.g., beam splitter, dichroic mirrors, collimating lenses, etc.)

In these embodiments, three or more photodetector arrays may be concentrically arranged, such as four or more photodetector arrays and including five or more concentrically arranged photodetector arrays. In certain instances, all of the photodetector arrays in the light detection system may be concentrically arranged. In other instances, light detection systems may include one or more groups of photodetector arrays which are concentrically arranged and one or more groups of photodetector arrays which are arranged in some other geometric configuration as described above. For example, in some embodiments, systems of interest include a first group of photodetector arrays that are concentrically arranged and a second group of photodetector arrays that are arranged in a different configuration, such as being linearly arranged.

In certain embodiments, the photodetector arrays are arranged linearly along a single axis. In these embodiments, light is serially propagated through each photodetector array. For instance, in one example the subject light detection system includes two photodetector arrays and light is propagated from the first photodetector array to the second photodetector array. In another example, the light detection system includes three photodetector arrays and light is propagated from the first photodetector array to the second photodetector array and then to the third photodetector array. In still another example, the light detection system includes four photodetector arrays and light is propagated from the first photodetector array to the second photodetector array to the third photodetector array and then to the fourth photodetector array. In certain embodiments, light detection systems of interest include 10 or more photodetector arrays that are linearly arranged and light propagates serially from the first photodetector array to the last photodetector array in the linear arrangement.

Figure 3:
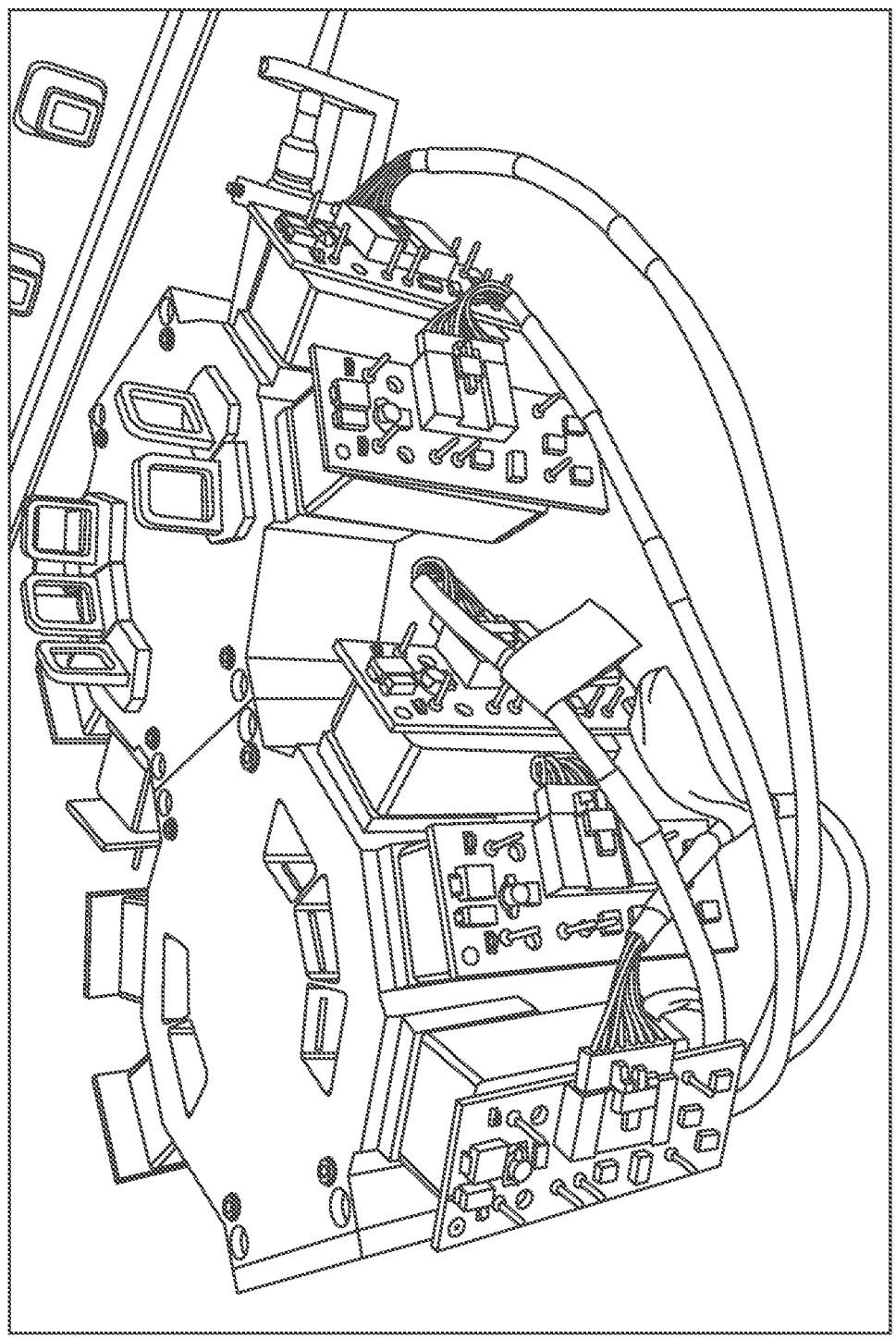
FIG. 3 depicts a photodetector array having a plurality of light detection systems arranged in a hexagonal configuration according to certain embodiments.

FIG. 3 depicts a photodetector array having a plurality of light detection systems arranged in a hexagonal configuration according to certain embodiments. Each of the subject light detection systems includes a photodetector, input modulator and output modulator soldered onto a printed circuit board and arranged in an array where each of the photodetectors in the array detect light from the same source.

Figure 4:
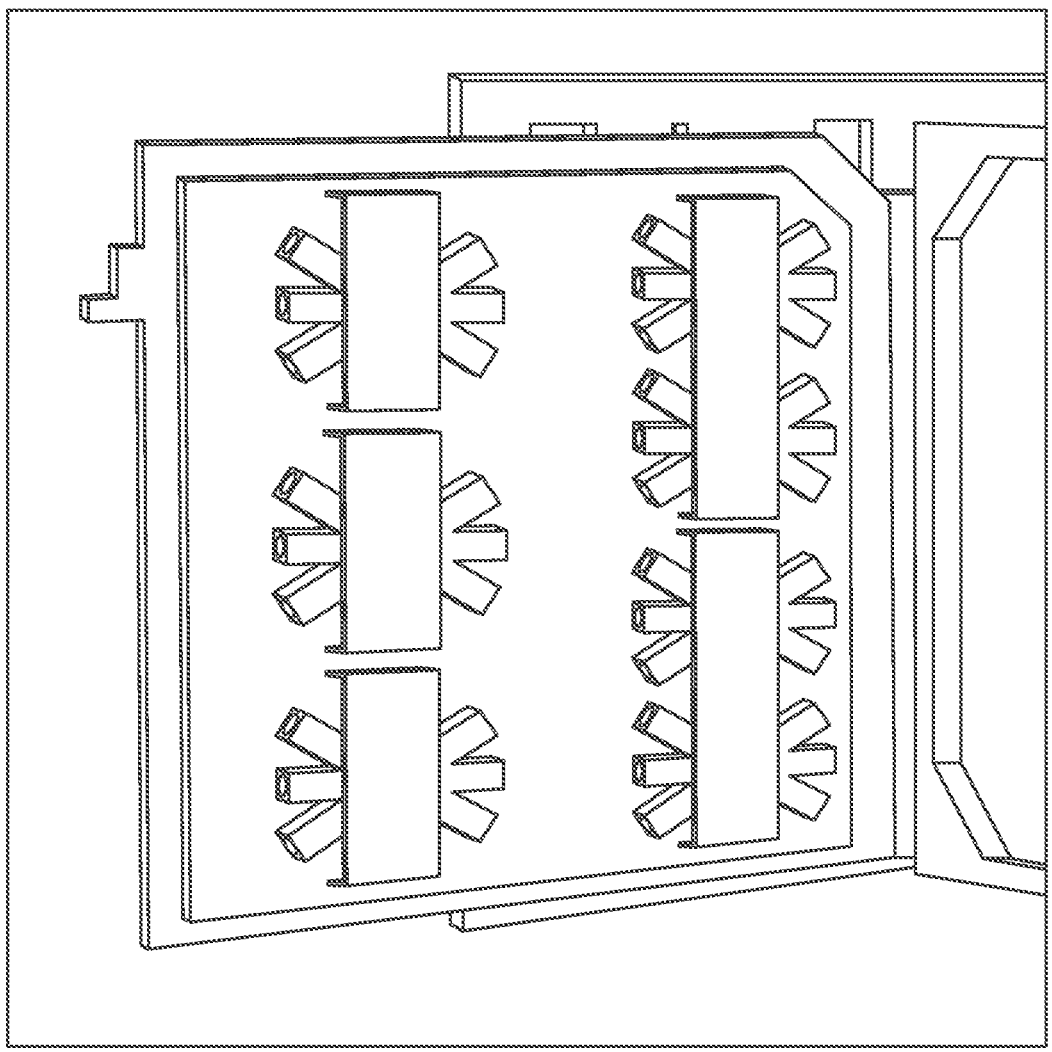
FIG. 4 depicts a plurality of photodetector arrays each having a plurality of light detection systems arranged in a decagonal configuration according to certain embodiments.

FIG. 4 depicts a plurality of photodetector arrays each having a plurality of light detection systems arranged in a decagonal configuration according to certain embodiments. In this embodiment, each of the photodetector arrays are mounted to an optics panel and light from the sample can be propagated to each photodetector array individually or to two or more of the photodetector array on the panel, such as 3 or more and including to all 5 photodetector arrays. In certain embodiments, the two photodetector arrays on the right side of the optics panel are in optical communication with each other through an optical adjustment component, such as a collimator (with or without a beamsplitter). In these embodiments, these photodetector arrays cascade the collected light from the sample through the photodetector array and onto the surface of each photodetector in the array, as described above. Each of the three photodetector arrays on the left side of the optics panel may be employed individually or may be configured to be positioned in optical communication with each other, such as by placing an optical adjustment component between each of these photodetector arrays.

In some embodiments, the light detection systems described herein are arranged in photodetector arrays such as those described in co-pending U.S. patent application No. 15/894,642 filed on Feb. 12, 2018, the disclosure of which is herein incorporated by reference in its entirety.

Methods for Matching Output Signals from Two or more Photodetectors

As summarized above, aspects of the present also include methods for matching output signals from two or more photodetectors. The term "matching output signals" is used herein to refer to modulating signals from the two or more photodetectors such that the signal outputs differ by 10% or less, such as 9% or less, such as by 8% or less, such as by 7% or less, such as by 6% or less, such as by 5% or less, such as by 4% or less, such as by 3% or less, such as by 2% or less, such as by 1% or less, such as by 0.5% or less, such as by 0.1% or less, such as by 0.01% or less and including by 0.001% or less. In some embodiments, the methods include matching the photon counts of two or more photodetectors in response to the same source of light. In other embodiments, the methods include matching voltage output from two or more photodetectors. In still other embodiments, the methods include matching the signal output such that the signals from the two or more photodetectors exhibit substantially the same signal-to-noise ratio. In some instances, matching outputs includes modulating one or more of the input and output signals of the photodetectors such that signal outputs are substantially the same (i.e., adjusting the signals to achieve the same photon count, voltage output, etc.). In other instances, matching outputs from the photodetectors includes modulating the input and output signals to achieve a predetermined value (i.e., adjusting the signals to be a predetermined photon count, voltage output, etc.).

In practicing the subject methods, light from a sample is detected with a first photodetector and a second photodetector and one or more of the input signal to the first photodetector, input signal to the second photodetector, output signal from the first photodetector and output signal from the second photodetector are modulated to match the output signals from the first photodetector with the second photodetector. In certain embodiments, methods include matching output signals for a plurality of photodetectors, such as 3 or more photodetectors, such as 4 or more, such as 5 of more, such as 10 or more and including 25 or more photodetectors.

In some embodiments, methods include modulating the signal input into one or more of the photodetectors. The signal input may be modulated, such as by increasing or decreasing the current to the photodetector. For example, the current may be increased by 5% or more, such as by 10% or more, such as by 15% or more, such as by 25% or more, such as by 50% or more, such as by 75% or more, such as by 90% or more, such as by 95% or more and including by 99% or more or the current may be reduced by 5% or more, such as by 10% or more, such as by 15% or more, such as by 25% or more, such as by 50% or more, such as by 75% or more, such as by 90% or more, such as by 95% or more and including by 99% or more. In other instances, the signal input is modulated by increasing or decreasing the voltage to the photodetector. For example, the voltage may be increased by 5% or more, such as by 10% or more, such as by 15% or more, such as by 25% or more, such as by 50% or more, such as by 75% or more, such as by 90% or more, such as by 95% or more and including by 99% or more or the voltage may be reduced by 5% or more, such as by 10% or more, such as by 15% or more, such as by 25% or more, such as by 50% or more, such as by 75% or more, such as by 90% or more, such as by 95% or more and including by 99% or more.

In other embodiments, methods include modulating the signal output from one or more of the photodetectors. The signal output may be modulated, such as by increasing or decreasing the current of the signal from the photodetector. For example, the current may be increased by 5% or more, such as by 10% or more, such as by 15% or more, such as by 25% or more, such as by 50% or more, such as by 75% or more, such as by 90% or more, such as by 95% or more and including by 99% or more or the current may be reduced by 5% or more, such as by 10% or more, such as by 15% or more, such as by 25% or more, such as by 50% or more, such as by 75% or more, such as by 90% or more, such as by 95% or more and including by 99% or more. In other instances, the signal input is modulated by increasing or decreasing the voltage of the signal from the photodetector. For example, the voltage may be increased by 5% or more, such as by 10% or more, such as by 15% or more, such as by 25% or more, such as by 50% or more, such as by 75% or more, such as by 90% or more, such as by 95% or more and including by 99% or more or the voltage may be reduced by 5% or more, such as by 10% or more, such as by 15% or more, such as by 25% or more, such as by 50% or more, such as by 75% or more, such as by 90% or more, such as by 95% or more and including by 99% or more.

The input and output signals may be modulated simultaneously or sequentially or a combination thereof. For example, the input signal and the output signal of one or more of the photodetectors may be simultaneously modulated to match the output signals of the photodetectors. In other embodiments, the input signal and the output signals are modulated sequentially where the input signal may be first modulated (e.g., increase current, reduce voltage, etc.) followed by modulation of the output signal. In still other embodiments, the input signals and output signals of each of the photodetectors are modulated independently of one another, such as where a predetermined output signal (e.g., 100 photon counts) is to be achieved.

Depending on the type of modulator employed (as described above), modulation of the input and output signals may be carried out in 60 microseconds or less, such as 30 microseconds or less, such as 15 microseconds or less, such as 10 microseconds or less, such as 5 microseconds or less, such as 1 microseconds or less, such as 0.1 microseconds or less, such as 0.01 microseconds or less, such as 0.001 microseconds or less, such as 0.0001 microseconds or less and including 0.00001 microseconds or less. Where an input or output signal from a photodetector is modulated more than one time, the time period between modulation of the input or output signal may be 0.001 microseconds or more, such as 0.01 microseconds or more, such as 0.1 microseconds or more, such as 1 microsecond or more, such as 5 microseconds or more, such as by 10 microseconds or more, such as by 15 microseconds or more, such as by 30 microseconds or more and including by 60 microseconds or more.

In one example, methods include matching photon counts from two or more photodetectors in response to the same source of light (e.g., an irradiated sample in a flow stream) by: detecting light from the sample with the photodetectors and modulating one or more of the input signal to the photodetectors and the output signal from the photodetectors so that the photo counts from the two or more photodetectors are substantially the same. In some embodiments, methods include modulating the input signal (e.g., current) to the photodetectors, modulating the output signal (e.g., voltage) from the photodetector or a combination thereof such that the photon count from the photodetectors differ by 1000 photons or less, such as 750 photons or less, such as by 500 photons or less, such as by 250 photons or less, such as by 100 photons or less, such as by 75 photons or less, such as by 50 photons or less, such as by 25 photons or less, such as by 10 photons or less and including differing by 5 photons or less.

In another example, methods include matching the output voltage from two or more photodetectors by: detecting light with the photodetectors and modulating one or more of the input signal to the photodetectors and the output signal from the photodetectors so that the output voltage from the two or more photodetectors differ by 10 mV or less, such as by 5 mV or less, such as by 4 mV or less, such as by 3 mV or less, such as by 2 mV or less, such as by 1 mV or less, such as by 0.5 mV or less, such as by 0.1 mV or less, such as by 0.01 mV or less and including by 0.001 mV or less.

Flow Cytometer Systems for Measuring Light Emitted by a Sample

Aspects of the present disclosure also include systems for measuring light from a sample (e.g., in the flow stream in a flow cytometer). In certain embodiments, systems include a light source and a light detection system having a photodetector, input modulator and output modulator, as described above. In some embodiments, the system is a flow cytometer. In some instances, the light detection system having the light detection component is non-releasably integrated into the flow cytometer. In certain embodiments, the light detection component is in optical communication with the source of sample (e.g., the flow stream in a flow cytometer) through an optical collection system (e.g., fiber optics or free-space light relay system).

Systems of interest for measuring light from a sample include a light source. In embodiments, the light source may be any suitable broadband or narrow band source of light. Depending on the components in the sample (e.g., cells, beads, non-cellular particles, etc.), the light source may be configured to emit wavelengths of light that vary, ranging from 200 nm to 1500 nm, such as from 250 nm to 1250 nm, such as from 300 nm to 1000 nm, such as from 350 nm to 900 nm and including from 400 nm to 800 nm. For example, the light source may include a broadband light source emitting light having wavelengths from 200 nm to 900 nm. In other instances, the light source includes a narrow band light source emitting a wavelength ranging from 200 nm to 900 nm. For example, the light source may be a narrow band LED (1 nm-25 nm) emitting light having a wavelength ranging between 200 nm to 900 nm. In some embodiments, the light source is a laser, such as continuous wave laser. For example, the laser may be a helium-neon (HeNe) laser. In certain embodiments, the light source is a laser in a flow cytometer.

In other embodiments, the light source is a non-laser light source, such as a lamp, including but not limited to a halogen lamp, deuterium arc lamp, xenon arc lamp, a light-emitting diode, such as a broadband LED with continuous spectrum, superluminescent emitting diode, semiconductor light emitting diode, wide spectrum LED white light source, an multi-LED integrated. In some instances the non-laser light source is a stabilized fiber-coupled broadband light source, white light source, among other light sources or any combination thereof.

In some embodiments, the light source is a laser. Lasers of interest may include pulsed lasers or continuous wave lasers. For example, the laser may be a gas laser, such as a helium-neon laser, argon laser, krypton laser, xenon laser, nitrogen laser, $CO_2$ laser, CO laser, argon-fluorine (ArF) excimer laser, krypton-fluorine (KrF) excimer laser, xenon chlorine (XeCl) excimer laser or xenon-fluorine (XeF) excimer laser or a combination thereof; a dye laser, such as a stilbene, coumarin or rhodamine laser; a metal-vapor laser, such as a helium-cadmium (HeCd) laser, helium-mercury (HeHg) laser, helium-selenium (HeSe) laser, helium-silver (HeAg) laser, strontium laser, neon-copper (NeCu) laser, copper laser or gold laser and combinations thereof; a solid-state laser, such as a ruby laser, an Nd:YAG laser, NdCrYAG laser, Er:YAG laser, Nd:YLF laser, Nd:YVO$_4$ laser, Nd:YCa$_4$O(BO$_3$)$_3$ laser, Nd:YCOB laser, titanium sapphire laser, thulim YAG laser, ytterbium YAG laser, ytterbium$_2$O$_3$ laser or cerium doped lasers and combinations thereof; a semiconductor diode laser, optically pumped semiconductor laser (OPSL), or a frequency doubled- or frequency tripled implementation of any of the above mentioned lasers.

The subject systems may include 1 or more lasers, such as 2 or more lasers, such as 3 or more lasers, such as 4 or more lasers, such as 5 or more lasers, such as 6 or more lasers, such as 7 or more lasers, such as 8 or more lasers and including 9 or more lasers. In embodiments, each laser may have the same or different wavelength emissions (i.e., excitation wavelength). For example, each laser may have an excitation wavelength that is from 200 nm to 900 nm. In certain embodiments, systems of interest include one or more lasers having excitation wavelengths selected from 355 nm, 375 nm, 405 nm, 488 nm, 532 nm, 561 nm, 633 nm, 635 nm and 640 nm.

In certain embodiments, light sources of interest include a laser excitation system that can be modified to incorporate one or more additional lasers (e.g., without substantial reconfiguration of laser position or addition of optical adjustment components). In certain instances, the laser excitation system is a modular configuration where lasers can be inserted or removed without any substantial configuration of the other lasers in the laser excitation system. In these embodiments, the laser excitation system may be configured to include 2 or more spatially separated lasers, such as 3 or more, such as 4 or more, such as 5 or more, such as 6 or more, such as 7 or more, such as 8 or more and including 9 or more lasers.

In certain embodiments, the light source is a light beam generator that is configured to generate two or more beams of frequency shifted light. In some instances, the light beam generator includes a laser, a radiofrequency generator configured to apply radiofrequency drive signals to an acousto-optic device to generate two or more angularly deflected laser beams. In these embodiments, the laser may be a pulsed lasers or continuous wave laser. For example lasers in light beam generators of interest may be a gas laser, such as a helium-neon laser, argon laser, krypton laser, xenon laser, nitrogen laser, CO2 laser, CO laser, argon-fluorine (ArF) excimer laser, krypton-fluorine (KrF) excimer laser, xenon chlorine (XeCl) excimer laser or xenon-fluorine (XeF) excimer laser or a combination thereof; a dye laser, such as a stilbene, coumarin or rhodamine laser; a metal-vapor laser, such as a helium-cadmium (HeCd) laser, helium-mercury (HeHg) laser, helium-selenium (HeSe) laser, helium-silver (HeAg) laser, strontium laser, neon-copper (NeCu) laser, copper laser or gold laser and combinations thereof; a solid-state laser, such as a ruby laser, an Nd:YAG laser, NdCrYAG laser, Er:YAG laser, Nd:YLF laser, Nd:YVO4 laser, Nd:YCa4O(BO3)3 laser, Nd:YCOB laser, titanium sapphire laser, thulim YAG laser, ytterbium YAG laser, ytterbium2O3 laser or cerium doped lasers and combinations thereof.

The acousto-optic device may be any convenient acousto-optic protocol configured to frequency shift laser light using applied acoustic waves. In certain embodiments, the acousto-optic device is an acousto-optic deflector. The acousto-optic device in the subject system is configured to generate angularly deflected laser beams from the light from the laser and the applied radiofrequency drive signals. The radiofrequency drive signals may be applied to the acousto-optic device with any suitable radiofrequency drive signal source, such as a direct digital synthesizer (DDS), arbitrary waveform generator (AWG), or electrical pulse generator.

In embodiments, a controller is configured to apply radiofrequency drive signals to the acousto-optic device to produce the desired number of angularly deflected laser beams in the output laser beam, such as being configured to apply 3 or more radiofrequency drive signals, such as 4 or more radiofrequency drive signals, such as 5 or more radiofrequency drive signals, such as 6 or more radiofrequency drive signals, such as 7 or more radiofrequency drive signals, such as 8 or more radiofrequency drive signals, such as 9 or more radiofrequency drive signals, such as 10 or more radiofrequency drive signals, such as 15 or more radiofrequency drive signals, such as 25 or more radiofrequency drive signals, such as 50 or more radiofrequency drive signals and including being configured to apply 100 or more radiofrequency drive signals.

In some instances, to produce an intensity profile of the angularly deflected laser beams in the output laser beam, the controller is configured to apply radiofrequency drive signals having an amplitude that varies such as from about 0.001 V to about 500 V, such as from about 0.005 V to about 400 V, such as from about 0.01 V to about 300 V, such as from about 0.05 V to about 200 V, such as from about 0.1 V to about 100 V, such as from about 0.5 V to about 75 V, such as from about 1 V to 50 V, such as from about 2 V to 40 V, such as from 3 V to about 30 V and including from about 5 V to about 25 V. Each applied radiofrequency drive signal has, in some embodiments, a frequency of from about 0.001 MHz to about 500 MHz, such as from about 0.005 MHz to about 400 MHz, such as from about 0.01 MHz to about 300 MHz, such as from about 0.05 MHz to about 200 MHz, such as from about 0.1 MHz to about 100 MHz, such as from about 0.5 MHz to about 90 MHz, such as from about 1 MHz to about 75 MHz, such as from about 2 MHz to about 70 MHz, such as from about 3 MHz to about 65 MHz, such as from about 4 MHz to about 60 MHz and including from about 5 MHz to about 50 MHz.

In certain embodiments, the controller has a processor having memory operably coupled to the processor such that the memory includes instructions stored thereon, which when executed by the processor, cause the processor to produce an output laser beam with angularly deflected laser beams having a desired intensity profile. For example, the memory may include instructions to produce two or more angularly deflected laser beams with the same intensities, such as 3 or more, such as 4 or more, such as 5 or more, such as 10 or more, such as 25 or more, such as 50 or more and including memory may include instructions to produce 100 or more angularly deflected laser beams with the same intensities. In other embodiments, the may include instructions to produce two or more angularly deflected laser beams with different intensities, such as 3 or more, such as 4 or more, such as 5 or more, such as 10 or more, such as 25 or more, such as 50 or more and including memory may include instructions to produce 100 or more angularly deflected laser beams with different intensities.

In certain embodiments, the controller has a processor having memory operably coupled to the processor such that the memory includes instructions stored thereon, which when executed by the processor, cause the processor to produce an output laser beam having increasing intensity from the edges to the center of the output laser beam along the horizontal axis. In these instances, the intensity of the angularly deflected laser beam at the center of the output beam may range from 0.1% to about 99% of the intensity of the angularly deflected laser beams at the edge of the output laser beam along the horizontal axis, such as from 0.5% to about 95%, such as from 1% to about 90%, such as from about 2% to about 85%, such as from about 3% to about 80%, such as from about 4% to about 75%, such as from about 5% to about 70%, such as from about 6% to about 65%, such as from about 7% to about 60%, such as from about 8% to about 55% and including from about 10% to about 50% of the intensity of the angularly deflected laser beams at the edge of the output laser beam along the horizontal axis. In other embodiments, the controller has a processor having memory operably coupled to the processor such that the memory includes instructions stored thereon, which when executed by the processor, cause the processor to produce an output laser beam having an increasing intensity from the edges to the center of the output laser beam along the horizontal axis. In these instances, the intensity of the angularly deflected laser beam at the edges of the output beam may range from 0.1% to about 99% of the intensity of the angularly deflected laser beams at the center of the output laser beam along the horizontal axis, such as from 0.5% to about 95%, such as from 1% to about 90%, such as from about 2% to about 85%, such as from about 3% to about 80%, such as from about 4% to about 75%, such as from about 5% to about 70%, such as from about 6% to about 65%, such as from about 7% to about 60%, such as from about 8% to about 55% and including from about 10% to about 50% of the intensity of the angularly deflected laser beams at the center of the output laser beam along the horizontal axis. In yet other embodiments, the controller has a processor having memory operably coupled to the processor such that the memory includes instructions stored thereon, which when executed by the processor, cause the processor to produce an output laser beam having an intensity profile with a Gaussian distribution along the horizontal axis. In still other embodiments, the controller has a processor having memory operably coupled to the processor such that the memory includes instructions stored thereon, which when executed by the processor, cause the processor to produce an output laser beam having a top hat intensity profile along the horizontal axis.

In embodiments, light beam generators of interest may be configured to produce angularly deflected laser beams in the output laser beam that are spatially separated. Depending on the applied radiofrequency drive signals and desired irradiation profile of the output laser beam, the angularly deflected laser beams may be separated by 0.001 μm or more, such as by 0.005 μm or more, such as by 0.01 μm or more, such as by 0.05 μm or more, such as by 0.1 μm or more, such as by 0.5 μm or more, such as by 1 μm or more, such as by 5 μm or more, such as by 10 μm or more, such as by 100 μm or more, such as by 500 μm or more, such as by 1000 μm or more and including by 5000 μm or more. In some embodiments, systems are configured to produce angularly deflected laser beams in the output laser beam that overlap, such as with an adjacent angularly deflected laser beam along a horizontal axis of the output laser beam. The overlap between adjacent angularly deflected laser beams (such as overlap of beam spots) may be an overlap of 0.001 μm or more, such as an overlap of 0.005 μm or more, such as an overlap of 0.01 μm or more, such as an overlap of 0.05 μm or more, such as an overlap of 0.1 μm or more, such as an overlap of 0.5 μm or more, such as an overlap of 1 μm or more, such as an overlap of 5 μm or more, such as an overlap of 10 μm or more and including an overlap of 100 μm or more.

In certain instances, light beam generators configured to generate two or more beams of frequency shifted light include laser excitation modules as described in U.S. Pat. Nos. 9,423,353; 9,784,661 and 10,006,852 and U.S. Patent Publication Nos. 2017/0133857 and 2017/0350803, the disclosures of which are herein incorporated by reference.

The light source may be positioned any suitable distance from the sample (e.g., the flow stream in a flow cytometer), such as at a distance of 0.001 mm or more from the flow stream, such as 0.005 mm or more, such as 0.01 mm or more, such as 0.05 mm or more, such as 0.1 mm or more, such as 0.5 mm or more, such as 1 mm or more, such as 5 mm or more, such as 10 mm or more, such as 25 mm or more and including at a distance of 100 mm or. In addition, the light source irradiate the sample at any suitable angle (e.g., relative the vertical axis of the flow stream), such as at an angle ranging from 10° to 90°, such as from 15° to 85°, such as from 20° to 80°, such as from 25° to 75° and including from 30° to 60°, for example at a 90° angle.

The light source may be configured to irradiate the sample continuously or in discrete intervals. In some instances, systems include a light source that is configured to irradiate the sample continuously, such as with a continuous wave laser that continuously irradiates the flow stream at the interrogation point in a flow cytometer. In other instances, systems of interest include a light source that is configured to irradiate the sample at discrete intervals, such as every 0.001 milliseconds, every 0.01 milliseconds, every 0.1 milliseconds, every 1 millisecond, every 10 milliseconds, every 100 milliseconds and including every 1000 milliseconds, or some other interval. Where the light source is configured to irradiate the sample at discrete intervals, systems may include one or more additional components to provide for intermittent irradiation of the sample with the light source. For example, the subject systems in these embodiments may include one or more laser beam choppers, manually or computer controlled beam stops for blocking and exposing the sample to the light source.

Light emitted by the sample is propagated to the subject light detection systems (as described above), such as a photodetector array having two or more of the light detection systems. As described above, photodetectors in the subject light detection systems may include, but are not limited to optical sensors, such as photomultiplier tubes, active-pixel sensors (APSs), avalanche photodiode, image sensors, charge-coupled devices (CODs), intensified charge-coupled devices (ICCDs), light emitting diodes, photon counters, bolometers, pyroelectric detectors, photoresistors, photovoltaic cells, photodiodes, phototransistors, quantum dot photoconductors or photodiodes and combinations thereof, among other photodetectors.

In embodiments of the present disclosure, photodetectors are configured to measure collected light at one or more wavelengths, such as at 2 or more wavelengths, such as at 5 or more different wavelengths, such as at 10 or more different wavelengths, such as at 25 or more different wavelengths, such as at 50 or more different wavelengths, such as at 100 or more different wavelengths, such as at 200 or more different wavelengths, such as at 300 or more different wavelengths and including measuring light emitted by a sample in the flow stream at 400 or more different wavelengths.

In some embodiments, photodetectors are configured to measure collected light over a range of wavelengths (e.g., 200 nm-1000 nm). In certain embodiments, photodetectors are configured to collect spectra of light over a range of wavelengths. For example, systems may include one or more photodetectors configured to collect spectra of light over one or more of the wavelength ranges of 200 nm-1000 nm. In yet other embodiments, photodetectors are configured to measure light emitted by a sample in the flow stream at one or more specific wavelengths. For example, systems may include one or more photodetectors configured to measure light at one or more of 450 nm, 518 nm, 519 nm, 561 nm, 578 nm, 605 nm, 607 nm, 625 nm, 650 nm, 660 nm, 667 nm, 670 nm, 668 nm, 695 nm, 710 nm, 723 nm, 780 nm, 785 nm, 647 nm, 617 nm and any combinations thereof. In certain embodiments, one or more photodetectors may be configured to be paired with specific fluorophores, such as those used with the sample in a fluorescence assay.

In embodiments, the photodetector is configured to measure light continuously or in discrete intervals. In some instances, photodetectors are configured to take measurements of the collected light continuously. In other instances, photodetectors are configured to take measurements in discrete intervals, such as measuring light every 0.001 millisecond, every 0.01 millisecond, every 0.1 millisecond, every 1 millisecond, every 10 milliseconds, every 100 milliseconds and including every 1000 milliseconds, or some other interval.

In some embodiments, systems for measuring light from sample include an optical collection system for collecting and directing light from the sample source (e.g., flow stream) to the subject light detection systems. The optical collection system may be any suitable light collection protocol that collects and directs the light. In some embodiments, the optical collection system includes fiber optics, such as a fiber optics light relay bundle. In other embodiments, the optical collection system is a free-space light relay system.

The optical collection system may be physically coupled to the photodetectors of the one or more light detection systems (e.g., physically coupled to a photodetector array as described above), such as with an adhesive, co-molded together or integrated into the light collection system. In certain embodiments, the optical collection system and the light detection system are integrated into a single unit. In other embodiments, the optical collection system is coupled to the light detection systems with an connector, such as with a hook and loop fasteners, magnets, latches, notches, countersinks, counter-bores, grooves, pins, tethers, hinges, Velcro, non-permanent adhesives or a combination thereof.

In other embodiments, the light detection systems and the optical collection system are in optical communication, but are not physically in contact. For example, the optical collection system may be positioned 0.001 mm or more from the light detection system, such as 0.005 mm or more, such as 0.01 mm or more, such as 0.05 mm or more, such as 0.1 mm or more, such as 0.5 mm or more, such as 1 mm or more, such as 10 mm or more, such as 25 mm or more, such as 50 mm or more and including 100 mm or more from the light detection systems.

In certain embodiments, the optical collection system includes fiber optics. For example, the optical collection system may be a fiber optics light relay bundle. Any fiber optics light relay system may be employed to propagate light. In certain embodiments, suitable fiber optics light relay systems for propagating light include, but are not limited to, fiber optics light relay systems such as those described in U.S. Pat. No. 6,809,804, the disclosure of which is herein incorporated by reference.

In other embodiments, the optical collection system is a free-space light relay system. The phrase "free-space light relay" is used herein in its conventional sense to refer to light propagation that employs a configuration of one or more optical components to direct light through free-space. In certain embodiments, the free-space light relay system includes a housing having a proximal end and a distal end and may include any combination of different optical adjustment components, such as one or more of lenses, mirrors, slits, pinholes, wavelength separators, or a combination thereof. For example, in some embodiments, free-space light relay systems of interest include one or more focusing lens. In other embodiments, the subject free-space light relay systems include one or more mirrors. In yet other embodiments, the free-space light relay system includes a collimating lens. In certain embodiments, suitable free-space light relay systems for propagating light include, but are not limited to, light relay systems such as those described in U.S. Pat. Nos. 7,643,142; 7,728,974 and 8,223,445, the disclosures of which is herein incorporated by reference.

In certain embodiments, systems of interest also include a particle (e.g., cell) sorting component. The term "sorting"

is used herein in its conventional sense to refer to separating components (e.g., droplets containing cells, droplets containing non-cellular particles such as biological macromolecules) of a sample and in some instances, delivering the separated components to one or more sample collection containers. For example, particle sorting devices may be configured for sorting 2 or more components of the sample, such as 3 or more components, such as 4 or more components, such as 5 or more components, such as 10 or more components, such as 15 or more components and including sorting 25 or more components of the sample.

The subject particle sorters may be configured to sort a sample (e.g., biological sample) into 1 or more sorting containers, such as 2 or more, such as 3 or more, such as 4 or more, such as 5 or more and including 6 or more sorting containers. In other words, the sample can be configured separate 1 or more components into its own distinct container, such as 2 or more, such as 3 or more, such as 4 or more, such as 5 or more and including 6 or more components into its own distinct container. The containers for sorting components of a sample with the subject systems may be arranged in any convenient configuration, including but not limited to a linear configuration, star-shaped configuration, a triangular configuration, a square configuration, rectangular configuration, trapezoidal configuration, triangular configuration, hexagonal configuration, heptagonal configuration, octagonal configuration, nonagonal configuration, decagonal configuration, dodecagonal configuration, circular configuration, oval configuration as well as irregular shaped configurations. In certain embodiments one or more of the containers are positioned at a lower height than an adjacent container, such as by 0.001 cm or more, such as 0.005 cm or more, such as by 0.01 cm or more, such as by 0.05 cm or more, such as by 0.1 cm or more, such as by 0.5 cm or more, such as by 1 cm or more and including by 2 cm or more.

In embodiments, systems may be configured to sort components of a sample into different types of containers, including but not limited to round-bottom and conical tubes, micro-centrifuge tubes, PCR (polymerase chain reaction) strips, 96 well plates and 384 well plates. In certain embodiments, the sorter is a cuvette-based sorter having interchangeable nozzles, such as nozzles of 70 µm, 85 µm, 100 µm and 130 µm.

In sorting the cell, systems are configured for data acquisition, analysis and recording, such as with a computer, where multiple data channels record data from one or more photodetectors or photodetector arrays. In these embodiments, analysis includes classifying and counting particles such that each particle is present as a set of digitized parameter values. The subject systems may be set to trigger on a selected parameter in order to distinguish the particles of interest from background and noise.

A particular subpopulation of interest may then further analyzed by "gating" based on the data collected for the entire population. To select an appropriate gate, the data is plotted so as to obtain the best separation of subpopulations possible. This procedure may be performed by plotting forward light scatter (FSC) vs. side (i.e., orthogonal) light scatter (SSC) on a two-dimensional dot plot. A subpopulation of particles is then selected (i.e., those cells within the gate) and particles that are not within the gate are excluded. Where desired, the gate may be selected by drawing a line around the desired subpopulation using a cursor on a computer screen. Only those particles within the gate are then further analyzed by plotting the other parameters for these particles, such as fluorescence. Where desired, the above analysis may be configured to yield counts of the particles of interest in the sample.

In some embodiments, particle sorters of interest include particle sorting modules having deflector plates, such as described in U.S. Patent Publication No. 2017/0299493, filed on Mar. 28, 2017, the disclosure of which is incorporated herein by reference. In certain embodiments, the subject particle sorters are configured to sort particles (e.g., cells) of a sample using a sort decision module having a plurality of sort decision units, such as those described in U.S. Provisional Patent Application No. 62/803,264, filed on Feb. 8, 2019, the disclosure of which is incorporated herein by reference.

Suitable flow cytometry systems and methods for analyzing samples include, but are not limited to those described in U.S. Pat. Nos. 9,952,076; 9,933,341; 9,726,527; 9,453,789; 9,200,334; 9,097,640; 9,095,494; 9,092,034; 8,975,595; 8,753,573; 8,233,146; 8,140,300; 7,544,326; 7,201,875; 7,129,505; 6,821,740; 6,813,017; 6,809,804; 6,372,506; 5,700,692; 5,643,796; 5,627,040; 5,620,842; 5,602,039, the disclosure of which are herein incorporated by reference in their entirety. In certain instances, flow cytometry systems of interest include the BD Biosciences FACSCanto™ II flow cytometer, BD Accuri™ flow cytometer, BD Biosciences FACSCelesta™ flow cytometer, BD Biosciences FACSLyric™ flow cytomter, BD Biosciences FACSVerse™ flow cytometer, BD Biosciences FACSymphony™ flow cytometer BD Biosciences LSRFortessa™ flow cytometer, BD Biosciences LSRFortess™ X-20 flow cytometer and BD Biosciences FACSCalibur™ cell sorter, a BD Biosciences FACSCount™ cell sorter, BD Biosciences FACSLyric™ cell sorter and BD Biosciences Via™ cell sorter or the like.

In certain embodiments, the subject systems are flow cytometric systems having an excitation module that uses radio-frequency multiplexed excitation to generate a plurality of frequency shifted beams of light. In these embodiments, the laser light generator may include a plurality of lasers and one or more acousto-optic components (e.g., an acoustooptic deflector, an acoustooptic frequency shifter) to generate a plurality of frequency shifted comb beams. One or more of the frequency shifted comb beams and local oscillator beams may be configured to be received by a beam shaping component as described here to produce one or more beams of frequency shifted light having a substantially constant intensity profile. In certain instances, the subject systems are flow cytometric systems having a laser excitation module as described in U.S. Pat. Nos. 9,423,353 and 9,784,661 and U.S. Patent Publication Nos. 2017/0133857 and 2017/0350803, the disclosures of which are herein incorporated by reference.

Methods for Measuring Light Collected from an Irradiated Sample

Aspects of the disclosure also include methods for measuring light from a sample (e.g., in the flow stream in a flow cytometer). In practicing methods according to embodiments, a sample is irradiated with a light source and light from the sample is detected with one or more of the light detection systems (e.g., a photodetector array having two or more of the subject light detection systems) as described above. In some embodiments, the sample is a biological sample. The term "biological sample" is used in its conventional sense to refer to a whole organism, plant, fungi or a subset of animal tissues, cells or component parts which may in certain instances be found in blood, mucus, lymphatic fluid, synovial fluid, cerebrospinal fluid, saliva, bronchoalveolar lavage, amniotic fluid, amniotic cord blood, urine, vaginal fluid and semen. As such, a "biological sample" refers to both the native organism or a subset of its tissues as well as to a homogenate, lysate or extract prepared from the organism or a subset of its tissues, including but not limited to, for example, plasma, serum, spinal fluid, lymph fluid, sections of the skin, respiratory, gastrointestinal, cardiovascular, and genitourinary tracts, tears, saliva, milk, blood cells, tumors, organs. Biological samples may be any type of organismic tissue, including both healthy and diseased tissue (e.g., cancerous, malignant, necrotic, etc.). In certain embodiments, the biological sample is a liquid sample, such as blood or derivative thereof, e.g., plasma, tears, urine, semen, etc., where in some instances the sample is a blood sample, including whole blood, such as blood obtained from venipuncture or fingerstick (where the blood may or may not be combined with any reagents prior to assay, such as preservatives, anticoagulants, etc.).

In certain embodiments the source of the sample is a "mammal" or "mammalian", where these terms are used broadly to describe organisms which are within the class mammalia, including the orders carnivore (e.g., dogs and cats), rodentia (e.g., mice, guinea pigs, and rats), and primates (e.g., humans, chimpanzees, and monkeys). In some instances, the subjects are humans. The methods may be applied to samples obtained from human subjects of both genders and at any stage of development (i.e., neonates, infant, juvenile, adolescent, adult), where in certain embodiments the human subject is a juvenile, adolescent or adult. While the present invention may be applied to samples from a human subject, it is to be understood that the methods may also be carried-out on samples from other animal subjects (that is, in "non-human subjects") such as, but not limited to, birds, mice, rats, dogs, cats, livestock and horses.

In practicing the subject methods, a sample (e.g., in a flow stream of a flow cytometer) is irradiated with light from a light source. In some embodiments, the light source is a broadband light source, emitting light having a broad range of wavelengths, such as for example, spanning 50 nm or more, such as 100 nm or more, such as 150 nm or more, such as 200 nm or more, such as 250 nm or more, such as 300 nm or more, such as 350 nm or more, such as 400 nm or more and including spanning 500 nm or more. For example, one suitable broadband light source emits light having wavelengths from 200 nm to 1500 nm. Another example of a suitable broadband light source includes a light source that emits light having wavelengths from 400 nm to 1000 nm. Where methods include irradiating with a broadband light source, broadband light source protocols of interest may include, but are not limited to, a halogen lamp, deuterium arc lamp, xenon arc lamp, stabilized fiber-coupled broadband light source, a broadband LED with continuous spectrum, superluminescent emitting diode, semiconductor light emitting diode, wide spectrum LED white light source, an multi-LED integrated white light source, among other broadband light sources or any combination thereof.

In other embodiments, methods includes irradiating with a narrow band light source emitting a particular wavelength or a narrow range of wavelengths, such as for example with a light source which emits light in a narrow range of wavelengths like a range of 50 nm or less, such as 40 nm or less, such as 30 nm or less, such as 25 nm or less, such as 20 nm or less, such as 15 nm or less, such as 10 nm or less, such as 5 nm or less, such as 2 nm or less and including light sources which emit a specific wavelength of light (i.e., monochromatic light). Where methods include irradiating with a narrow band light source, narrow band light source protocols of interest may include, but are not limited to, a narrow wavelength LED, laser diode or a broadband light source coupled to one or more optical bandpass filters, diffraction gratings, monochromators or any combination thereof.

In certain embodiments, methods include irradiating the sample with one or more lasers. As discussed above, the type and number of lasers will vary depending on the sample as well as desired light collected and may be a gas laser, such as a helium-neon laser, argon laser, krypton laser, xenon laser, nitrogen laser, $CO_2$ laser, CO laser, argon-fluorine (ArF) excimer laser, krypton-fluorine (KrF) excimer laser, xenon chlorine (XeCl) excimer laser or xenon-fluorine (XeF) excimer laser or a combination thereof. In others instances, the methods include irradiating the flow stream with a dye laser, such as a stilbene, coumarin or rhodamine laser. In yet other instances, methods include irradiating the flow stream with a metal-vapor laser, such as a helium-cadmium (HeCd) laser, helium-mercury (HeHg) laser, helium-selenium (HeSe) laser, helium-silver (HeAg) laser, strontium laser, neon-copper (NeCu) laser, copper laser or gold laser and combinations thereof. In still other instances, methods include irradiating the flow stream with a solid-state laser, such as a ruby laser, an Nd:YAG laser, NdCrYAG laser, Er:YAG laser, Nd:YLF laser, Nd:YVO$_4$ laser, Nd:YCa$_4$O(BO$_3$)$_3$ laser, Nd:YCOB laser, titanium sapphire laser, thulim YAG laser, ytterbium YAG laser, ytterbium$_2$O$_3$ laser or cerium doped lasers and combinations thereof.

The sample may be irradiated with one or more of the above mentioned light sources, such as 2 or more light sources, such as 3 or more light sources, such as 4 or more light sources, such as 5 or more light sources and including 10 or more light sources. The light source may include any combination of types of light sources. For example, in some embodiments, the methods include irradiating the sample in the flow stream with an array of lasers, such as an array having one or more gas lasers, one or more dye lasers and one or more solid-state lasers.

The sample may be irradiated with wavelengths ranging from 200 nm to 1500 nm, such as from 250 nm to 1250 nm, such as from 300 nm to 1000 nm, such as from 350 nm to 900 nm and including from 400 nm to 800 nm. For example, where the light source is a broadband light source, the sample may be irradiated with wavelengths from 200 nm to 900 nm. In other instances, where the light source includes a plurality of narrow band light sources, the sample may be irradiated with specific wavelengths in the range from 200 nm to 900 nm. For example, the light source may be plurality of narrow band LEDs (1 nm-25 nm) each independently emitting light having a range of wavelengths between 200 nm to 900 nm. In other embodiments, the narrow band light source includes one or more lasers (such as a laser array) and the sample is irradiated with specific wavelengths ranging from 200 nm to 700 nm, such as with a laser array having gas lasers, excimer lasers, dye lasers, metal vapor lasers and solid-state laser as described above.

Where more than one light source is employed, the sample may be irradiated with the light sources simultaneously or sequentially, or a combination thereof. For example, the sample may be simultaneously irradiated with each of the light sources. In other embodiments, the flow stream is sequentially irradiated with each of the light sources. Where more than one light source is employed to irradiate the sample sequentially, the time each light source irradiates the sample may independently be 0.001 microseconds or more, such as 0.01 microseconds or more, such as 0.1 microseconds or more, such as 1 microsecond or more, such as 5 microseconds or more, such as 10 microseconds or more, such as 30 microseconds or more and including 60 microseconds or more. For example, methods may include irradiating the sample with the light source (e.g. laser) for a duration which ranges from 0.001 microseconds to 100 microseconds, such as from 0.01 microseconds to 75 microseconds, such as from 0.1 microseconds to 50 microseconds, such as from 1 microsecond to 25 microseconds and including from 5 microseconds to 10 microseconds. In embodiments where sample is sequentially irradiated with two or more light sources, the duration sample is irradiated by each light source may be the same or different.

The time period between irradiation by each light source may also vary, as desired, being separated independently by a delay of 0.001 microseconds or more, such as 0.01 microseconds or more, such as 0.1 microseconds or more, such as 1 microsecond or more, such as 5 microseconds or more, such as by 10 microseconds or more, such as by 15 microseconds or more, such as by 30 microseconds or more and including by 60 microseconds or more. For example, the time period between irradiation by each light source may range from 0.001 microseconds to 60 microseconds, such as from 0.01 microseconds to 50 microseconds, such as from 0.1 microseconds to 35 microseconds, such as from 1 microsecond to 25 microseconds and including from 5 microseconds to 10 microseconds. In certain embodiments, the time period between irradiation by each light source is 10 microseconds. In embodiments where sample is sequentially irradiated by more than two (i.e., 3 or more) light sources, the delay between irradiation by each light source may be the same or different.

The sample may be irradiated continuously or in discrete intervals. In some instances, methods include irradiating the sample in the sample with the light source continuously. In other instances, the sample in is irradiated with the light source in discrete intervals, such as irradiating every 0.001 millisecond, every 0.01 millisecond, every 0.1 millisecond, every 1 millisecond, every 10 milliseconds, every 100 milliseconds and including every 1000 milliseconds, or some other interval.

Depending on the light source, the sample may be irradiated from a distance which varies such as 0.01 mm or more, such as 0.05 mm or more, such as 0.1 mm or more, such as 0.5 mm or more, such as 1 mm or more, such as 2.5 mm or more, such as 5 mm or more, such as 10 mm or more, such as 15 mm or more, such as 25 mm or more and including 50 mm or more. Also, the angle or irradiation may also vary, ranging from 10° to 90°, such as from 15° to 85°, such as from 20° to 80°, such as from 25° to 75° and including from 30° to 60°, for example at a 90° angle.

As discussed above, in embodiments light from the irradiated sample is conveyed to a light detection system as described herein and measured by one or more photodetectors. In practicing the subject methods, light is propagated to the photodetectors of the light detection systems. Light directed to each photodetector is detected at one or more wavelengths, such as at 5 or more different wavelengths, such as at 10 or more different wavelengths, such as at 25 or more different wavelengths, such as at 50 or more different wavelengths, such as at 100 or more different wavelengths, such as at 200 or more different wavelengths, such as at 300 or more different wavelengths and including measuring the collected light at 400 or more different wavelengths.

In some embodiments, methods include measuring the collected light over a range of wavelengths (e.g., 200 nm-1000 nm). For example, methods may include collecting spectra of light over one or more of the wavelength ranges of 200 nm-1000 nm. In yet other embodiments, methods include measuring collected light at one or more specific wavelengths. For example, the collected light may be measured at one or more of 450 nm, 518 nm, 519 nm, 561 nm, 578 nm, 605 nm, 607 nm, 625 nm, 650 nm, 660 nm, 667 nm, 670 nm, 668 nm, 695 nm, 710 nm, 723 nm, 780 nm, 785 nm, 647 nm, 617 nm and any combinations thereof. In certain embodiments, methods including measuring wavelengths of light which correspond to the fluorescence peak wavelength of certain fluorophores.

The collected light may be measured continuously or in discrete intervals. In some instances, methods include taking measurements of the light continuously. In other instances, the light is measured in discrete intervals, such as measuring light every 0.001 millisecond, every 0.01 millisecond, every 0.1 millisecond, every 1 millisecond, every 10 milliseconds, every 100 milliseconds and including every 1000 milliseconds, or some other interval.

Measurements of the collected light may be taken one or more times during the subject methods, such as 2 or more times, such as 3 or more times, such as 5 or more times and including 10 or more times. In certain embodiments, methods include matching the signal output from each of the photodetectors, as described in detail above.

In some embodiments, methods include adjusting the light before detecting the light with the subject light detection systems. For example, the light from the sample source may be passed through one or more lenses, mirrors, pinholes, slits, gratings, light refractors, and any combination thereof. In some instances, the collected light is passed through one or more focusing lenses, such as to reduce the profile of the light directed to the light detection system or optical collection system as described above. In other instances, the emitted light from the sample is passed through one or more collimators.

Methods in certain embodiment also include data acquisition, analysis and recording, such as with a computer, wherein multiple data channels record data from each detector for the light scatter and fluorescence emitted by each particle as it passes through the sample interrogation region of a particle sorting component. In these embodiments, analysis includes classifying and counting particles such that each particle is present as a set of digitized parameter values. The subject systems may be set to trigger on a selected parameter in order to distinguish the particles of interest from background and noise. "Trigger" refers to a preset threshold for detection of a parameter and may be used as a means for detecting passage of a particle through the light source. Detection of an event that exceeds the threshold for the selected parameter triggers acquisition of light scatter and fluorescence data for the particle. Data is not acquired for particles or other components in the medium being assayed which cause a response below the threshold. The trigger parameter may be the detection of forward scattered light caused by passage of a particle through the light beam. The flow cytometer then detects and collects the light scatter and fluorescence data for the particle.

A particular subpopulation of interest is then further analyzed by "gating" based on the data collected for the entire population. To select an appropriate gate, the data is plotted so as to obtain the best separation of subpopulations possible. This procedure may be performed by plotting forward light scatter (FSC) vs. side (i.e., orthogonal) light scatter (SSC) on a two dimensional dot plot. A subpopulation of particles is then selected (i.e., those cells within the gate) and particles that are not within the gate are excluded. Where desired, the gate may be selected by drawing a line around the desired subpopulation using a cursor on a computer screen. Only those particles within the gate are then further analyzed by plotting the other parameters for these particles, such as fluorescence. Where desired, the above analysis may be configured to yield counts of the particles of interest in the sample.

In certain embodiments, the system operates to determine a timeslot during which one or more containers at a distal end of a particle sorting component are aligned with the deflected droplet receiving location. In some instances, the deflection signal includes an initial deflection sub-signal and a final deflection sub-signal; and the system operates to produce the deflection signal by sending an initial deflection sub-signal at the beginning of the timeslot that configures the deflector to deflect an analyzed droplet, when present. In certain cases, methods include sending a final deflection sub-signal to the particle sorting component at the end of the timeslot that configures the deflector not to deflect an analyzed droplet. In some embodiments, methods include sending a final deflection sub-signal to the particle sorting component after a single analyzed droplet has been deflected during the timeslot, where the final deflection sub-signal configures the deflector not to deflect an analyzed droplet.

Computer Controlled Systems

Aspects of the present disclosure further include computer controlled systems for practicing the subject methods, where the systems further include one or more computers for complete automation or partial automation of a system for practicing methods described herein. In some embodiments, systems include a computer having a computer readable storage medium with a computer program stored thereon, where the computer program when loaded on the computer includes instructions for detecting light from a sample with two or more photodetectors and modulating one or more of an input signal into the photodetectors and the output signals from the photodetectors to match the signal output from the photodetectors. In some embodiments, the computer program includes instructions for matching photon counts from the photodetectors. In other embodiments, the computer program includes instructions for matching output voltage from the photodetectors. In still other embodiments, the computer program includes instructions for matching signal-to-noise ratio of the photodetectors.

In some embodiments, photosensitivity matching between two or more photodetectors may be automated, such as where the subject computer controlled systems include computer readable storage medium having algorithm for automatically matching output signals from the two or more photodetectors. For example, the computer readable storage medium may include algorithm for automatically modulating one or more of the input signal to the photodetectors or output signal from the photodetectors so that the output signals achieve a predetermined value (e.g., a specified photon count or output voltage). In other instances, the computer readable storage medium may include algorithm for automatically modulating one or more of the input signal to the photodetectors or output signal from the photodetectors so that the output signals differ from each other by 10% or less, such as 9 % or less, such as by 8% or less, such as by 7% or less, such as by 6% or less, such as by 5% or less, such as by 4% or less, such as by 3% or less, such as by 2% or less, such as by 1% or less, such as by 0.5% or less, such as by 0.1% or less, such as by 0.01% or less and including by 0.001% or less.

In other embodiments, photosensitivity matching between two or more photodetectors is user-requested, such as where the user of the subject computer controlled systems inputs commands or parameters for matching output signals from the two or more photodetectors. In one example, the user may input commands or parameters into the system to modulate one or more of the input signal to the photodetectors or output signal from the photodetectors so that the output signals achieve a predetermined value (e.g., a specified photon count or output voltage). In another example, the user may enter commands or parameters into the system to modulate one or more of the input signal to the photodetectors or output signal from the photodetectors so that the output signals differ from each other by 10% or less, such as 9% or less, such as by 8% or less, such as by 7% or less, such as by 6% or less, such as by 5% or less, such as by 4% or less, such as by 3% or less, such as by 2% or less, such as by 1% or less, such as by 0.5% or less, such as by 0.1% or less, such as by 0.01% or less and including by 0.001% or less.

In some instances, the computer readable storage medium includes algorithm for increasing or decreasing current to the photodetector. For example, the computer readable storage medium includes algorithm for increasing the current by 5% or more, such as by 10% or more, such as by 15% or more, such as by 25% or more, such as by 50% or more, such as by 75% or more, such as by 90% or more, such as by 95% or more and including by 99% or more or reducing the current by 5% or more, such as by 10% or more, such as by 15% or more, such as by 25% or more, such as by 50% or more, such as by 75% or more, such as by 90% or more, such as by 95% or more and including by 99% or more.

In other instances, the computer readable storage medium includes algorithm for increasing or decreasing voltage the photodetector. For example, the computer readable storage medium includes algorithm for increasing the voltage by 5% or more, such as by 10% or more, such as by 15% or more, such as by 25% or more, such as by 50% or more, such as by 75% or more, such as by 90% or more, such as by 95% or more and including by 99% or more or reducing the voltage by 5% or more, such as by 10% or more, such as by 15% or more, such as by 25% or more, such as by 50% or more, such as by 75% or more, such as by 90% or more, such as by 95% or more and including by 99% or more.

In other embodiments, the computer readable storage medium includes algorithm for increasing or decreasing the current of the output signal from the photodetector. For example, the computer readable storage medium includes algorithm for increasing the current of the output signal from the photodetector by 5% or more, such as by 10% or more, such as by 15% or more, such as by 25% or more, such as by 50% or more, such as by 75% or more, such as by 90% or more, such as by 95% or more and including by 99% or more or reducing the current of the output signal from the photodetector by 5% or more, such as by 10% or more, such as by 15% or more, such as by 25% or more, such as by 50% or more, such as by 75% or more, such as by 90% or more, such as by 95% or more and including by 99% or more.

In still other embodiments, the computer readable storage medium includes algorithm for increasing or decreasing the voltage of the output signal from the photodetector. For example, the computer readable storage medium includes algorithm for increasing the voltage of the output signal from the photodetector by 5% or more, such as by 10% or more, such as by 15% or more, such as by 25% or more, such as by 50% or more, such as by 75% or more, such as by 90% or more, such as by 95% or more and including by 99% or more or reducing the voltage of the output signal from the photodetector by 5% or more, such as by 10% or more, such as by 15% or more, such as by 25% or more, such as by 50% or more, such as by 75% or more, such as by 90% or more, such as by 95% or more and including by 99% or more.

Systems may include a display and operator input device. Operator input devices may, for example, be a keyboard, mouse, or the like. The processing module includes a processor which has access to a memory having instructions stored thereon for performing the steps of the subject methods. The processing module may include an operating system, a graphical user interface (GUI) controller, a system memory, memory storage devices, and input-output controllers, cache memory, a data backup unit, and many other devices. The processor may be a commercially available processor or it may be one of other processors that are or will become available. The processor executes the operating system and the operating system interfaces with firmware and hardware in a well-known manner, and facilitates the processor in coordinating and executing the functions of various computer programs that may be written in a variety of programming languages, such as Java, C++, other high level or low level languages, as well as combinations thereof, as is known in the art. The operating system, typically in cooperation with the processor, coordinates and executes functions of the other components of the computer. The operating system also provides scheduling, input-output control, file and data management, memory management, and communication control and related services, all in accordance with known techniques. The processor may be any suitable analog or digital system. In some embodiments, the processor includes analog electronics which provide feedback control, such as for example negative feedback control.

The system memory may be any of a variety of known or future memory storage devices. Examples include any commonly available random access memory (RAM), magnetic medium such as a resident hard disk or tape, an optical medium such as a read and write compact disc, flash memory devices, or other memory storage device. The memory storage device may be any of a variety of known or future devices, including a compact disk drive, a tape drive, a removable hard disk drive, or a diskette drive. Such types of memory storage devices typically read from, and/or write to, a program storage medium (not shown) such as, respectively, flash memory, an SD card, solid state hard drives, or other form of optical or magnetic memory devices. Any of these program storage media, or others now in use or that may later be developed, may be considered a computer program product. As will be appreciated, these program storage media typically store a computer software program and/or data. Computer software programs, also called computer control logic, typically are stored in system memory and/or the program storage device used in conjunction with the memory storage device.

In some embodiments, a computer program product is described comprising a computer usable medium having control logic (computer software program, including program code) stored therein. The control logic, when executed by the processor the computer, causes the processor to perform functions described herein. In other embodiments, some functions are implemented primarily in hardware using, for example, a hardware state machine. Implementation of the hardware state machine so as to perform the functions described herein will be apparent to those skilled in the relevant arts.

Memory may be any suitable device in which the processor can store and retrieve data, such as magnetic, optical, or solid state storage devices (including magnetic or optical disks or tape or RAM, or any other suitable device, either fixed or portable). The processor may include a general purpose digital microprocessor suitably programmed from a computer readable medium carrying necessary program code. Programming can be provided remotely to processor through a communication channel, or previously saved in a computer program product such as memory or some other portable or fixed computer readable storage medium using any of those devices in connection with memory. For example, a magnetic or optical disk may carry the programming, and can be read by a disk writer/reader. Systems of the invention also include programming, e.g., in the form of computer program products, algorithms for use in practicing the methods as described above. Programming according to the present invention can be recorded on computer readable media, e.g., any medium that can be read and accessed directly by a computer. Such media include, but are not limited to: magnetic storage media, hard disc storage medium; optical storage media such as DVDs, Blu-Ray, CD-ROM; electrical storage media such as RAM and ROM; portable flash drive; and hybrids of these categories such as magnetic/optical storage media.

The processor may also have access to a communication channel to communicate with a user at a remote location. By remote location is meant the user is not directly in contact with the system and relays input information to an input manager from an external device, such as a a computer connected to a Wide Area Network ("WAN"), telephone network, satellite network, or any other suitable communication channel, including a smartphone.

In some embodiments, systems according to the present disclosure may be configured to include a communication interface. In some embodiments, the communication interface includes a receiver and/or transmitter for communicating with a network and/or another device. The communication interface can be configured for wired or wireless communication, including, but not limited to, radio frequency (RF) communication (e.g., Radio-Frequency Identification (RFID), WiFi, infrared, wireless Universal Serial Bus (USB), Ultra Wide Band (UWB), Bluetooth® communication protocols, and cellular communication, such as code division multiple access (CDMA) or Global System for Mobile communications (GSM).

In one embodiment, the communication interface is configured to include one or more communication ports, e.g., physical ports or interfaces such as a USB port, lightning ports, USB-C ports, or any other suitable electrical connection port to allow data communication between the subject systems and other external devices such as a computer terminal (for example, at a physician's office or in hospital environment) that is configured for similar complementary data communication.

In one embodiment, the communication interface is configured for infrared communication, Bluetooth® communication, or any other suitable wireless communication protocol to enable the subject systems to communicate with other devices such as computer terminals and/or networks, communication enabled mobile telephones, personal digital assistants, or any other communication devices which the user may use in conjunction.

In one embodiment, the communication interface is configured to provide a connection for data transfer utilizing Internet Protocol (IP) through a cell phone network, Short Message Service (SMS), wireless connection to a personal computer (PC) on a Local Area Network (LAN) which is connected to the internet, or WiFi connection to the internet at a WiFi hotspot.

In one embodiment, the subject systems are configured to wirelessly communicate with a server device via the communication interface, e.g., using a common standard such as 802.11 or Bluetooth® RF protocol, or an IrDA infrared protocol. The server device may be another portable device, such as a smart phone, tablet computer or notebook computer; or a larger device such as a desktop computer, appliance, etc. In some embodiments, the server device has a display, such as a liquid crystal display (LCD) or light emitting diode display (LED), as well as an input device, such as buttons, a keyboard, mouse or a touch-screen.

In some embodiments, the communication interface is configured to automatically or semi-automatically communicate data stored in the subject systems, e.g., in an optional data storage unit, with a network or server device using one or more of the communication protocols and/or mechanisms described above.

Output controllers may include controllers for any of a variety of known display devices for presenting information to a user, whether a human or a machine, whether local or remote. If one of the display devices provides visual information, this information typically may be logically and/or physically organized as an array of picture elements. A graphical user interface (GUI) controller may include any of a variety of known or future software programs for providing graphical input and output interfaces between the system and a user, and for processing user inputs. The functional elements of the computer may communicate with each other via system bus. Some of these communications may be accomplished in alternative embodiments using network or other types of remote communications. The output manager may also provide information generated by the processing module to a user at a remote location, e.g., over the Internet, phone or satellite network, in accordance with known techniques. The presentation of data by the output manager may be implemented in accordance with a variety of known techniques. As some examples, data may include SQL, HTML or XML documents, email or other files, or data in other forms. The data may include Internet URL addresses so that a user may retrieve additional SQL, HTML, XML, or other documents or data from remote sources. The one or more platforms present in the subject systems may be any type of known computer platform or a type to be developed in the future, although they typically will be of a class of computer commonly referred to as servers. However, they may also be a main-frame computer, a work station, or other computer type. They may be connected via any known or future type of cabling or other communication system including wireless systems, either networked or otherwise. They may be co-located or they may be physically separated. Various operating systems may be employed on any of the computer platforms, possibly depending on the type and/or make of computer platform chosen. Appropriate operating systems include Windows 10, iOS, Sun Solaris, Linux, OS/400, Compaq Tru64 Unix, SGI IRIX, Siemens Reliant Unix, Ubuntu, Zorin OS and others.

Kits

Aspects of the invention further include kits, where kits include one or more components of the light detection systems described herein, such as one or more photodetectors, input modulators and output modulators. Kits may also include a substrate, such as a printed circuit board for mounting the photodetector, input modulator and output modulator. Optical adjustment components such as lenses, mirrors, collimators, wavelength separators, pinholes may also be included in the kits. The various components of the kits may be present in separate containers, or some or all of them may be pre-combined. For example, in some instances, one or more components of the kit, e.g., photodetector, input modulator, output modulator are pre-mounted (e.g., soldered) onto a printed circuit board and present in a sealed pouch, e.g., a sterile foil pouch or envelope.

In some instances, the kits can include one or more assay components (e.g., labeled reagents, buffers, etc., such as described above). In some instances, the kits may further include a sample collection device, e.g., a lance or needle configured to prick skin to obtain a whole blood sample, a pipette, etc., as desired.

In addition to the above components, the subject kits may further include (in certain embodiments) instructions for practicing the subject methods. These instructions may be present in the subject kits in a variety of forms, one or more of which may be present in the kit. One form in which these instructions may be present is as printed information on a suitable medium or substrate, e.g., a piece or pieces of paper on which the information is printed, in the packaging of the kit, in a package insert, and the like. Yet another form of these instructions is a computer readable medium, e.g., diskette, compact disk (CD), portable flash drive, and the like, on which the information has been recorded. Yet another form of these instructions that may be present is a website address which may be used via the internet to access the information at a removed site.

Utility

The subject light detection systems find use in a variety of applications where it is desirable to analyze and sort particle components in a sample in a fluid medium, such as a biological sample. Light detection systems, e.g., as described herein, also find use in flow cytometry where it is desirable to provide a flow cytometer with improved cell sorting accuracy, enhanced particle collection, reduced energy consumption, particle charging efficiency, more accurate particle charging and enhanced particle deflection during cell sorting. For example, the subject light detection systems find use where cell sorting accuracy and particle collection is enhanced by consistent photodetector photosensitivity and matched photosensitivity by different photodetectors.

Light detection systems, e.g., as described herein, also find use in applications where cells prepared from a biological sample may be desired for research, laboratory testing or for use in therapy. In some embodiments, the subject methods and devices may facilitate the obtaining individual cells prepared from a target fluidic or tissue biological sample. For example, the subject methods and systems facilitate obtaining cells from fluidic or tissue samples to be used as a research or diagnostic specimen for diseases such as cancer. Likewise, the subject methods and systems facilitate obtaining cells from fluidic or tissue samples to be used in therapy. Methods and devices of the present disclosure allow for separating and collecting cells from a biological sample (e.g., organ, tissue, tissue fragment, fluid) with enhanced efficiency, modularity and low cost as compared to traditional flow cytometry systems.

In at least some of the previously described embodiments, one or more elements used in an embodiment can interchangeably be used in another embodiment unless such a replacement is not technically feasible. It will be appreciated by those skilled in the art that various other omissions, additions and modifications may be made to the methods and structures described above without departing from the scope of the claimed subject matter. All such modifications and changes are intended to fall within the scope of the subject matter, as defined by the appended claims.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible sub-ranges and combinations of sub-ranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into sub-ranges as discussed above. Finally, as will be understood by one skilled in the art, a range includes each individual member. Thus, for example, a group having 1-3 articles refers to groups having 1, 2, or 3 articles. Similarly, a group having 1-5 articles refers to groups having 1, 2, 3, 4, or 5 articles, and so forth.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

Accordingly, the preceding merely illustrates the principles of the invention. It will be appreciated that those skilled in the art will be able to devise various arrangements which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. Moreover, nothing disclosed herein is intended to be dedicated to the public regardless of whether such disclosure is explicitly recited in the claims.

The scope of the present invention, therefore, is not intended to be limited to the exemplary embodiments shown and described herein. Rather, the scope and spirit of present invention is embodied by the appended claims. In the claims, 35 U.S.C. § 112(f) or 35 U.S.C. § 112(6) is expressly defined as being invoked for a limitation in the claim only when the exact phrase "means for" or the exact phrase "step for" is recited at the beginning of such limitation in the claim; if such exact phrase is not used in a limitation in the claim, then 35 U.S.C. § 112 (f) or 35 U.S.C. § 112(6) is not invoked.

What is claimed is:

1. A light detection system comprising:
   a photodetector;
   an input modulator configured to modulate signal input into the photodetector, wherein the input modulator comprises an amplifier;
   an output modulator configured to modulate signal output from the photodetector; and
   a substrate, wherein the photodetector, the input modulator and the output modulator are positioned on a surface of the substrate.

2. The light detection system according to claim 1, wherein the photodetector comprises a photomultiplier tube.

3. The light detection system according to claim 1, wherein the photodetector comprises a photodiode.

4. The light detection system according to claim 3, wherein the photodiode is an avalanche photodiode.

5. The light detection system according to claim 1, wherein the photodetector comprises a photocathode and an avalanche photodiode.

6. The light detection system according to claim 1, wherein the amplifier is a transimpedance amplifier.

7. The light detection system according to claim 1, wherein the input modulator comprises an array of resistors.

8. The light detection system according to claim 1, wherein the input modulator comprises an array of resistors and capacitors.

9. The light detection system according to claim 1, wherein the input modulator is configured to increase the current of the signal input into the photodetector.

10. The light detection system according to claim 1, wherein the input modulator is configured to increase the voltage of the signal input into the photodetector.

11. The light detection system according to claim 1, wherein the output modulator comprises an amplifier.

12. The light detection system according to claim 11, wherein the amplifier is a transimpedance amplifier.

13. The light detection system according to claim 1, wherein the output modulator comprises an array of resistors.

14. The light detection system according to claim 1, wherein the output modulator comprises an array of resistors and capacitors.

15. The light detection system according to claim 1, wherein the output modulator is configured to increase the current of the signal output from the photodetector.

16. The light detection system according to claim 1, wherein the output modulator is configured to increase the voltage of the signal output into the photodetector.

17. The light detection system according to claim 1, wherein the substrate is a printed circuit board.

18. A method of matching output signals from a first photodetector and a second photodetector, the method comprising:

detecting light from a sample with the first photodetector;
detecting light from the sample with the second photodetector; and
modulating one or more of:
   an input signal into the first photodetector via a first input modulator,
   an input signal into the second photodetector via a second input modulator, wherein each of the first and second input modulators comprises an amplifier,
   the output signal from the first photodetector via a first output modulator, and
   the output signal from the second photodetector via a second output modulator, to match the output signals from the first photodetector and the second photodetector, wherein the first photodetector, first input modulator and first output modulator are positioned on a first substrate, and the second photodetector, second input modulator and second output modulator are positioned on a second substrate.

19. A flow cytometer comprising:
a light source for irradiating sample in a flow stream; and
a light detection system comprising:
   a photodetector;
   an input modulator configured to modulate signal input into the photodetector, wherein the input modulator comprises an amplifier;
   an output modulator configured to modulate signal output from the photodetector; and
   a substrate, wherein the photodetector, the input modulator and the output modulator are positioned on a surface of the substrate.

20. The light detection system according to claim 1, wherein the input modulator is positioned on the substrate at a distance of 15 cm or less from the photodetector.

21. The light detection system according to claim 1, wherein the output modulator is positioned on the substrate at a distance of 15 cm or less from the photodetector.

* * * * *